US011925175B2

(12) United States Patent
Yoo et al.

(10) Patent No.: US 11,925,175 B2
(45) Date of Patent: Mar. 12, 2024

(54) WATER SUPPLY DEVICE FOR PETS AND METHOD FOR CONTROLLING SAME

(71) Applicant: LG ELECTRONICS INC., Seoul (KR)

(72) Inventors: Hyunsun Yoo, Seoul (KR); Sungkyung Kim, Seoul (KR); Joogyeom Kim, Seoul (KR); Yousook Eun, Seoul (KR); Jaehung Chun, Seoul (KR); Myongsun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 211 days.

(21) Appl. No.: 17/277,902

(22) PCT Filed: Sep. 19, 2019

(86) PCT No.: PCT/KR2019/012180

§ 371 (c)(1),
(2) Date: Mar. 19, 2021

(87) PCT Pub. No.: WO2020/060248

PCT Pub. Date: Mar. 26, 2020

(65) Prior Publication Data

US 2021/0345582 A1 Nov. 11, 2021

Related U.S. Application Data

(60) Provisional application No. 62/733,393, filed on Sep. 19, 2018.

(30) Foreign Application Priority Data

Oct. 31, 2018 (KR) ........................ 10-2018-0131631
Oct. 31, 2018 (KR) ........................ 10-2018-0131632
(Continued)

(51) Int. Cl.
*A01K 7/02* (2006.01)
*A01K 7/06* (2006.01)

(52) U.S. Cl.
CPC .............. *A01K 7/025* (2013.01); *A01K 7/027* (2013.01); *A01K 7/06* (2013.01)

(58) Field of Classification Search
CPC . A01K 7/00; A01K 7/02; A01K 7/022; A01K 7/025; A01K 7/027; A01K 7/04;
(Continued)

(56) References Cited

U.S. PATENT DOCUMENTS 7,270,082 B2 9/2007 Plante
7,743,698 B2 6/2010 Muir et al.
(Continued)

FOREIGN PATENT DOCUMENTS

CN 104351107 2/2015
CN 205284571 6/2016
(Continued)

OTHER PUBLICATIONS

Japanese Office Action dated Apr. 19, 2022 issued in Application No. 2021-515125.
(Continued)

*Primary Examiner* — Peter M Poon
*Assistant Examiner* — Danielle A Clerkley
(74) *Attorney, Agent, or Firm* — KED & ASSOCIATES, LLP

(57) ABSTRACT

The present disclosure relates to a water supplier for a pet and a control method thereof, that is, a water supplier for a pet that operates a thermoelectric element by sensing the temperature of water stored in a water tub through a water temperature sensor, operates a warning unit by sensing the level of the water stored in a water tub through a water level sensor, operates a pump by sensing a pet within a predeter-
(Continued)

34
32
30
63
50
51
11a
11
10
40
11b
12 mined distance range through a proximity sensor, and cuts power or keeps the inclination of a water dispenser horizontal by sensing the inclination of the water tub through a gyro sensor, and a method of controlling the water supplier.

13 Claims, 24 Drawing Sheets

(30) Foreign Application Priority Data

Oct. 31, 2018 (KR) ........................ 10-2018-0131634
Nov. 1, 2018 (KR) ........................ 10-2018-0132707

(58) Field of Classification Search
CPC .......... A01K 7/06; A01K 5/00; A01K 5/0291; A01K 39/00; A01K 39/02
USPC ...................................................... 119/72, 73
See application file for complete search history.

(56) References Cited

U.S. PATENT DOCUMENTS 8,117,991 B1 * 2/2012 Civitillo ................. A01K 7/027 119/72
8,146,535 B1 * 4/2012 Neumann .............. A01K 7/027 119/72
9,874,882 B2 * 1/2018 Hymes ..................... A01K 7/02
10,091,972 B1 * 10/2018 Jensen ..................... A01K 7/02
10,194,637 B2 * 2/2019 Armstrong ............... A01K 7/02
10,264,762 B1 * 4/2019 Lamb ..................... A01K 1/035
10,352,759 B1 * 7/2019 Jensen ................... A47G 23/12
2006/0174838 A1 8/2006 Plante
2008/0223300 A1 * 9/2008 Kates .................... G01S 13/825 119/72
2012/0111280 A1 5/2012 Shin et al.
2012/0299731 A1 * 11/2012 Triener ................ G08B 21/182 702/19
2016/0174522 A1 * 6/2016 Colica ...................... G05D 9/12 119/73
2017/0099804 A1 * 4/2017 Chang ...................... A01K 7/06
2018/0160649 A1 6/2018 Hicks et al.

FOREIGN PATENT DOCUMENTS

CN 107897027 4/2018
CN 207322313 5/2018
CN 108175344 6/2018
CN 207831207 9/2018
EP 3315022 5/2018
GB 805211 12/1958
JP H 02-31628 2/1990
JP H2-79920 3/1990
JP 11-276007 10/1999
JP 3101582 6/2004
JP 3172425 12/2011
JP 3210777 6/2017
JP 2018-509931 4/2018
KR 10-2014-0110739 9/2014
KR 10-2017-0126697 11/2017
WO WO-2015022608 A1 * 2/2015 ........... A01K 29/005

OTHER PUBLICATIONS

Japanese Office Action dated Jan. 11, 2022 issued in Application No. 2021-515125.
Chinese Office Action dated Mar. 2, 2022 issued in Application No. 201980075876.3 (English translation attached).
International Search Report dated Jan. 17, 2020 issued in Application No. PCT/KR2019/012180.
Chinese Office Action dated Jul. 31, 2023, issued in Chinese Patent appl. No. 201980075876.3.
Chinese Notice of Allowance dated Nov. 23, 2023, issued in Chinese Patent appl. No. 201980075876.3.
Korean Office Action dated Nov. 28, 2023, issued in Korean Patent appl. No. 10-2018-0132707.

* cited by examiner

WATER SUPPLY DEVICE FOR PETS AND METHOD FOR CONTROLLING SAME

CROSS-REFERENCE TO RELATED PATENT APPLICATIONS

This application is a U.S. National Stage Application under 35 U.S.C. § 371 of PCT Application No. PCT/KR2019/012180, filed Sep. 19, 2019, which claims priority to U.S. Provisional Application Ser. No. 62/733,393 and Korean Patent Application Nos. 10-2018-0131631, filed Oct. 31, 2018, 10-2018-0131632, filed Oct. 31, 2018, 10-2018-0131634, filed Oct. 31, 2018 and 10-2018-0132707, filed Nov. 1, 2018, whose entire disclosures are hereby incorporated by reference.

BACKGROUND OF THE DISCLOSURE

Field of the Disclosure

The present disclosure relates to a water supplier for a pet and a control method thereof and, more particularly, to a water supplier for a pet including a water tub, a sensor installed in the water tub, and a controller operating on the basis of a value sensed by the sensor, and a method of controlling the water supplier.

Related Art

Recently, not only people who raise pets are increasing, and love and interest in pets are gradually increasing, so a lot of devices for pets are being developed.

Pets have to frequently drink water to maintain their biorhythm, but pets are left alone in many cases and have difficulty in communicating with human, so the interest in a water supplier that can always supply clean water to pets are increasing.

A 'water fountain for a pet' including a base functioning as a water tub, a pump installed in the base, a stand pipe delivering water discharged from the pump, and a bowl being supplied with water from the stand pipe have been disclosed in U.S. Pat. No. 7,270,082B1 (hereafter, referred to as 'prior art').

However, the prior art has a problem that it does not have a device for maintaining the temperature of the water stored in the base at a temperature that is suitable for a pet to drink the water.

Further, the prior art has a problem that since there is no device that informs a user of the level of the water stored in the base, it is required to frequently check the amount of water stored in the base in order to prevent lack of water stored in the base.

SUMMARY

An object of the present disclosure is to provide a water supplier for a pet that can maintain the temperature of water stored in a water tub at a temperature suitable for a pet to drink the water using a thermoelectric element, and a method of controlling the water supplier.

Another object of the present disclosure is to provide a water supplier for a pet that informs a user of lack of water when water stored in a water tub become insufficient, and a method of controlling the water supplier.

Another object of the present disclosure is to provide a device and method of controlling a water supplier for a pet that can reduce power consumption by operating a pump only when a pet comes and stays within a predetermine distance to drink water.

Another object of the present disclosure is to provide a water supplier for a pet that prevents a pet from being injured or getting shocked when the water supplier inclines or overturns, and a method of controlling the water supplier.

The objects of the present disclosure are not limited to the objects described above and other objects will be clearly understood by those skilled in the art from the following description.

In order to achieve the objects, a water supplier for a pet and a control method thereof according to an embodiment of the present disclosure includes a water tub storing water, a sensor installed at a lower portion of the water tub, and a controller comparing a value sensed by the sensor with a predetermined setting value.

The water supplier may further include a thermoelectric element cooling the water stored in the water tub, in which the sensor may include a water temperature sensor sensing the temperature of the water stored in the water tub, and the controller may operate the thermoelectric element when the temperature sensed by the water temperature sensor is a first water temperature sensor value or more.

The water tub may have a floor plate and a side wall, and the thermoelectric element may be disposed under the floor plate.

The water tub may have a floor plate and a side wall, the side wall may have a lower edge wall disposed under the floor plate and further has a base covering the bottom of the lower edge wall, and the water temperature sensor may be disposed between the floor plate and the base.

The water supplier may further include: a pump installed in the water tub; a water supply pipe delivering water discharged from the pump; and a water supply plate disposed over the water tub and having a top on which water supplied from the water supply pipe flows.

The sensor may include a water level sensor sensing the level of water stored in the water tub, and the controller may operate a warning unit when the water level sensed by the water level sensor is a first water level setting value or less.

The controller may operate the warning unit when the water level sensed by the water level sensor is a second water level setting value, which is larger than the first water level setting value, or more.

The water tub may have a side wall, the side wall may have a lower edge wall disposed under the floor plate, and the water level sensor may be disposed on an edge surface protruding inside the lower edge wall.

The sensor may include a plurality of proximity sensor sensing a pet within a predetermined distance range, and the controller may operate a pump installed in the water tub when at least one of the proximity sensors senses the pet over setting time.

The controller may increase a pumping volume of the pump when the number of proximity sensors sensing a pet over the setting time increases while the pump is operated.

The water tub may have a floor plate and a side wall, the side wall may have a lower edge wall disposed under the floor plate, and the proximity sensors may be installed inside the lower edge wall.

The sensor may include a gyro sensor sensing an inclination of the water tub, and the controller may cut power when an inclination sensed by the gyro sensor is larger than a first inclination setting value.

The water tub may have a side wall forming a side, the side wall may have a lower edge wall having a rounded lower portion, and the gyro sensor may be disposed inside the lower edge wall.

The water supplier may include a warning lamp showing a danger signal and disposed at a lower portion of the water tub, in which the warning light may be turned on which a first color when an inclination sensed by the sensor is larger than a second inclination setting value.

The sensor may include a gyro sensor sensing a variation of an inclination of the water tub, and the controller may cut power when an inclination variation sensed by the gyro sensor is larger than a first inclination variation setting value.

The water supplier may include: a pump pumping up water in the water tub; a water dispenser supplying the water pumped up from the pump; a water dispenser rotor rotating the water dispenser under the water dispenser; and a gyro sensor sensing an inclination of the water tub, in which the controller may keep the inclination of the water dispenser horizontal on the basis of the inclination of the water tub sensed by the gyro sensor.

The details of other exemplary embodiments are included in the following detailed description and the accompanying drawings.

Advantageous Effects

According to the water supplier for a pet and a method of controlling the water supplier of the present disclosure, one or more effects can be achieved as follows.

First, there is an effect that it is possible to maintain the temperature stored on the water tub at a temperature suitable for a pet to drink the water using the thermoelectric element.

Second, there is another effect that when the level of the water stored in the water tub sensed by the water level sensor is the first water level setting value or less, the controller can inform a user of lack of water by determining that the water stored in the water tub is insufficient and operating the warning unit.

Third, since a plurality of proximity sensors is spaced apart from each other around the water supplier for a pet and the pump is operated only when a pet approaches the water supplier for a pet and stays over setting time, there is another effect that power consumption can be reduced.

Fourth, since the gyro sensor senses the inclination of the water supplier and power supplied to the water supplier is cut when the inclination is a setting inclination or more, there is another effect that an electric shock to a pet is effectively prevented even though the water supplier is considerably inclined.

The effects of the present disclosure are not limited to those described above and other effects not stated herein may be made apparent to those skilled in the art from claims.

DESCRIPTION OF EXEMPLARY EMBODIMENTS

Figure 1:
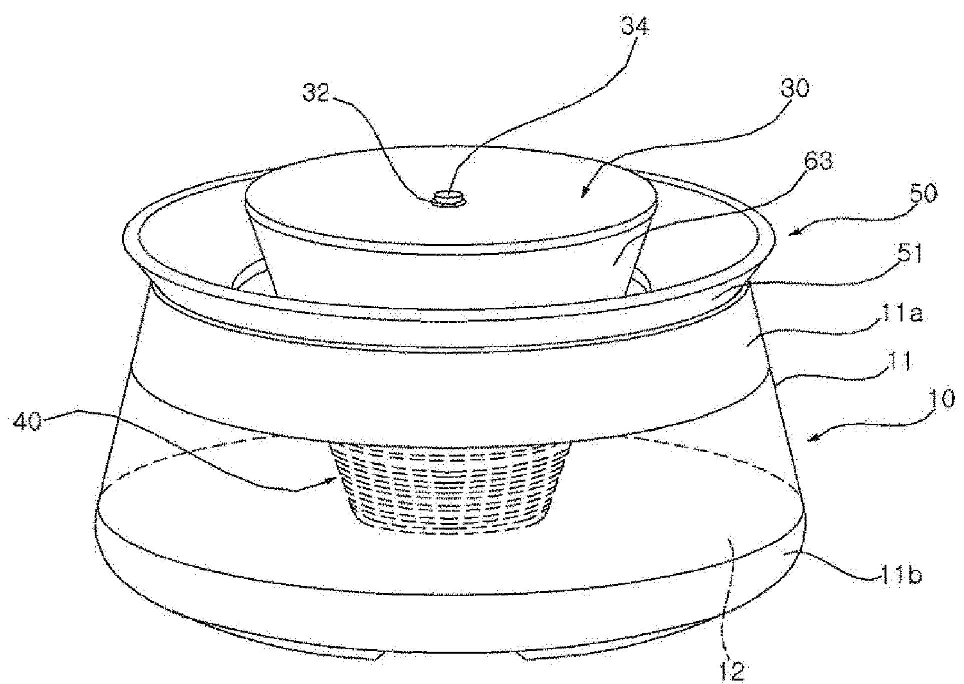
FIG. 1 is a perspective view showing the external appearance of a water supplier for a pet of the present disclosure.

The advantages, features, and method for achieving them of the present disclosure will be clear by referring to the embodiments to be described below. However, the present disclosure is not limited to the exemplary embodiments described hereafter and may be implemented in various ways, and the exemplary embodiments are provided to complete the description of the present disclosure and let those skilled in the art completely know the scope of the present disclosure and the present disclosure is defined by claims. Like reference numerals indicate the same components throughout the specification.

Thicknesses are enlarged to clearly show several layers and regions. However, the thicknesses of some layers and regions are exaggerated for the convenience of description.

When an element such as a layer, a film, a region, and a plate is "on" or "over" another component in the specification, it can be directly on the other element or intervening elements may be present therebetween. On the other hand, when an element is "directly on" another component, there is no object therebetween. When an element such as a layer, a film, a region, and a plate is "beneath" or "under" another component, it can be directly beneath the other element or intervening elements may be present therebetween. On the other hand, when an element is "directly under" another component, there is no object therebetween.

A water supplier for a pet according to an embodiment of the present disclosure fundamentally can pump up and supply water stored in a water tub to a water supply plate and can supply water in various flow states by circulating the water supplied to the water supply plate back to the water tub. The configuration and operation of a water supplier for a pet and a method of controlling the water supplier according to an embodiment of the present disclosure are described with reference to FIGS. 1 to 13.

A water supplier for a pet according to an embodiment of the present disclosure includes a water tub 10 storing water, a thermoelectric element 81 cooling the water stored in the water tub 10, a water temperature sensor 85 sensing the temperature of the water stored in the water tub 10, and a controller C controlling the thermoelectric element 81 in accordance with the water temperature sensed by the water temperature sensor 85.

Figure 2:
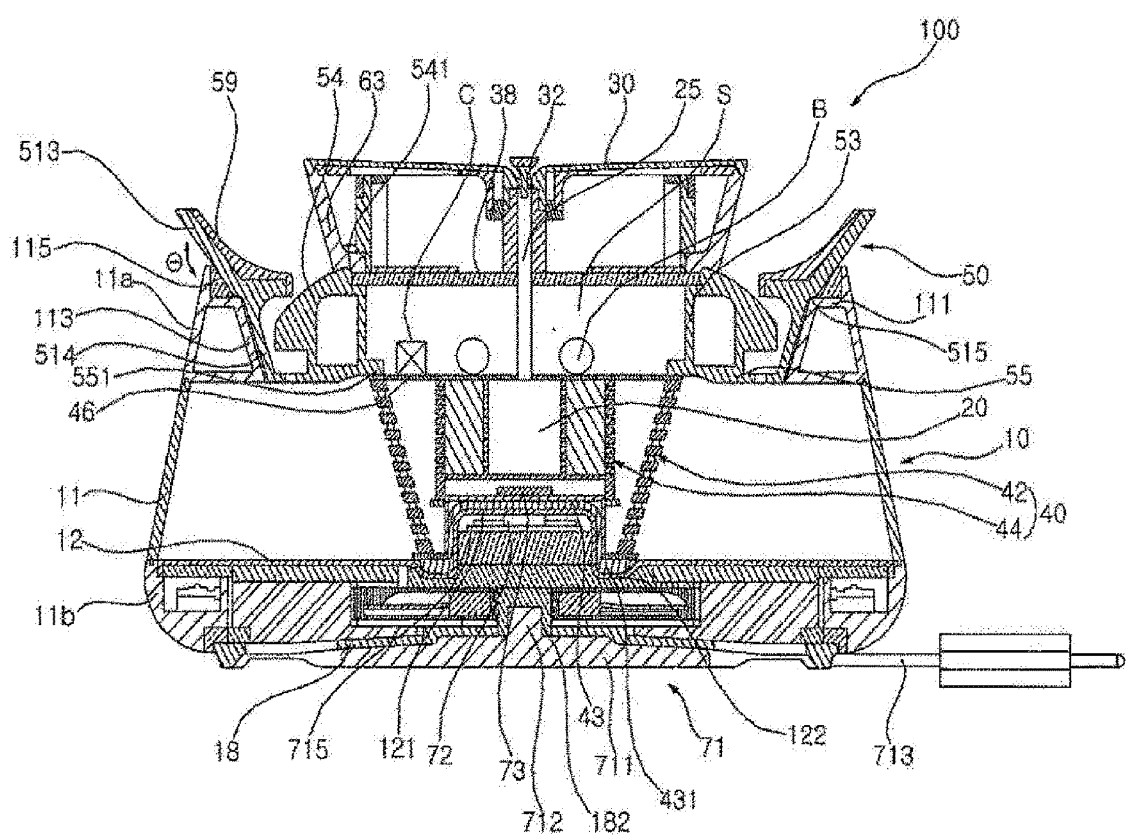
FIG. 2 is a side cross-sectional view of the water supplier for a pet shown in FIG. 1.

Referring to FIGS. 1 and 2, the water tub 10 may be open upward.

The water supplier for a pet may further include a pump 20 installed in the water tub 10, a water supply pipe 25 delivering water discharged from the pump 20, a water supply plate 30 disposed over the water tub 10 and having a top on which water supplied from the water supply pipe 25 flows, and a water tray 50 covering the open top of the water tub 10, disposed under the water supply plate 30, and receiving and discharging water from the water supply plate 30 into the water tub 10.

The pump 20 is disposed at the center in the water tub 10. A water supply hole 32 for supplying water supplied from the water supply pipe 25 to the top of the water supply plate 30 is formed at the center of the water supply plate 30. The water moving to the top of the water supply plate 30 through the water supply hole 32 is supplied to the water tray 50 through the edge of the water supply plate 30.

The water supplier for a pet may include the water tub 10 and an inner assembly 100 disposed in the open upper portion of the water tub 10. That is, the water supplier for a pet is composed of two parts of the water tub 10 and the inner assembly 100, so a user can separate the inner assembly 100 from the water tub 10 by lifting the inner assembly 100. The user can replace the water stored in the water tub 10 or can wash the inside of the water tub 10 after separating the inner assembly 100 from the water tub 10.

The inner assembly 100 may include the pump 20, the water supply pipe 25, the water supply plate 30, and the water tray 50.

The pump 20, the water supply pipe 25, the water supply plate 30, and the water tray 50 may be integrated, thereby configuring the single inner assembly 100.

When a use lifts the inner assembly 100, the inner assembly 100 can be separated from the water tub 10. A user can separate the inner assembly 100 from the water tub 10 by holding the water tray 50, which is the lowermost component of the components disposed outside the water tub 10 of the inner assembly, and lifting the inner assembly 100. The user can easily replace the water stored in the water tub 10 and can wash the inside of the water tub 10 after separating the inner assembly 100 from the water tub 10.

The inner assembly 100 may further include a filter 40 that filters the water stored in the water tub 10. When the inner assembly 100 further includes the filter 40, the inner assembly 100 may be further integrated with the filter 40. That is, when the inner assembly 100 further includes the filter 40, the pump 20, the water supply pipe 25, the water supply plate 30, the water tray 50, and the filter 40 may be integrated, thereby being able to configure a single inner assembly 100.

When the inner assembly 100 further includes the filter 40, the pump 20 may pump the water filtered by the filter 40.

The filter 40 may be disposed under the water tray 50. The filter 40 may be coupled to the bottom of the water tray 50.

The filter 40 may include a first filter 42 and a second filter 44 disposed inside the first filter 42. A support cylinder body 44*b* may be installed under the second filter 44 in the first filter 42.

The inner assembly 100 may further include at least one UV (Ultraviolet) ray sterilization filter 47, 48, 49 that sterilizes water. When the inner assembly 100 further includes at least one UV ray sterilization filter 47, 48, 49, the inner assembly 100 may be further integrated with the at least one UV ray sterilization filter 47, 48, 49. That is, when the inner assembly 100 further includes at least one UV ray sterilization filter 47, 48, 49, the pump 20, the water supply pipe 25, the water supply plate 30, the water tray 50, the filter 40, and the at least one UV ray sterilization filter 47, 48, 49 may be integrated, thereby being able to configure a single inner assembly 100.

The at least one UV ray sterilization filter 47, 48, 49 may include a UV LED (Ultraviolet Light-Emitting Diode) and can diffuse the light generated by the UV LED>

The at least one UV ray sterilization filter 47, 48, 49 may include UV sterilization filters 47 and 48 that sterilize the water stored in the water tub 10 and a UV sterilization filter 49 that sterilizes the water discharged from the water supply pipe 25.

The water tub 10 may include side walls 11, 11*a*, and 11*b* and a floor plate 12. The side walls 11, 11*a*, and 11*b* may include a transparent main side wall 11, an upper side wall 11*a* disposed over the main side wall 11 and made of an opaque material, and a lower edge wall 11*b* positioned under the main side wall 11 and made of an opaque material.

The lower edge wall 11*b* may be disposed under the floor plate 12. The main side wall 11 may be disposed over the floor plate 12 and the lower edge wall 11*b* may be disposed under the floor plate 12.

The main side wall 11, the upper side wall 11*a*, and the lower edge wall 11*b* may be made of different materials. The main side wall may be a part inside which water is substantially stored. A user can check the amount of water and the degree of contamination of the water inside the main side wall 11 from the outside of the transparent main side wall 11.

Protrusive walls 111, 112, and 113 may be formed on the inner surfaces of the side walls 11, 11*a*, and 11*b* of the water tub 10. The protrusive walls 111, 112, and 113 may have an inner inclined surface 113 on the inner surface. An outer inclined surface 514 supported on the inner inclined surface 113 may protrude from the outer surface of the water tray 50.

The protrusive walls 111, 112, and 113 may be formed on the inner surface of the upper side wall 11*a*.

The lower portion of the inner assembly 100 may be inserted into the water tub 10 and the other upper portion may protrude upward from the water tub 10.

The upper portion of the outer surface of the water tray 50 may be inserted into the water tub 10 and the upper portion thereof may protrude out of the water tub 10.

The pump 20 and the filter 40 may be inserted into the water tub 10, under the water tray 50.

The water supply plate 30 may be disposed over the water tray 50. The lower portion of the water supply plate 30 may be inserted into the water tray 50 and the upper portion thereof may protrude upward from the water tray 50.

The inner assembly 100 may further include a partition plate 38. The partition plate 38 may be spaced downward apart from the water supply plate 30. The water supply pipe may be disposed through the partition plate 38. The partition plate 38 may be inserted into a groove 541 formed at the upper portion of the water tray 50. The partition plate 38 may be inserted into a groove 541 formed at the upper portion of the inner side wall 54 of the water tray 50.

The water supply plate 30 and the partition plate 38 may be coupled to a cylindrical side member 63. The side member 63 may be disposed over the water tray 50. The side member 63 may be disposed over the water tray 50. The side member 63 may be a light guide plate that emits light by light generated by a luminous body 61. The side member 63 may be disposed under the water supply plate 30. The side member 63 may connect the water supply plate 30 and the partition plate 38 to each other. The side member 63 may be formed in a trumpet shape widening upward. The top and bottom of the side member 63 may be open. The water supply plate 30 can cover the open top of the side member 63 and the partition plate 38 can cover the open bottom of the side member 63. The water supply plate 30 and the side member 63 may be disposed over the inner side wall 54 of the water tray 50. Hereafter, the side member 63 is referred to as a light guide plate 63.

The pump 20 is installed in the water tub 10 and can pump up the water stored in the water tub. The pump 20 may be disposed at the center in the water tub 10. The pump 20 may be spaced upward apart from the floor plate 12 of the water tub 10. The water supplied from the water supply pipe 25 may collect on the top 31 and then may overflow the edge of the water supply plate 30.

The water tray 50 may be disposed between the water tub 10 and the water supply plate 30.

The filter 40 may be installed in the water tub 10. The filter 40 may be disposed at the center in the water tub 10. The filter 40 can filter out foreign substances in the water stored in the water tub 10 before the water flows into the pump 20.

The water supplier for a pet may include a power supplier, a lighting device, a water level sensor, a water temperature sensor, a contamination degree sensor, a water temperature maintainer, a sterilization filter, etc.

Hereafter, the components included in an embodiment of the present disclosure are described in detail.

Figure 3:
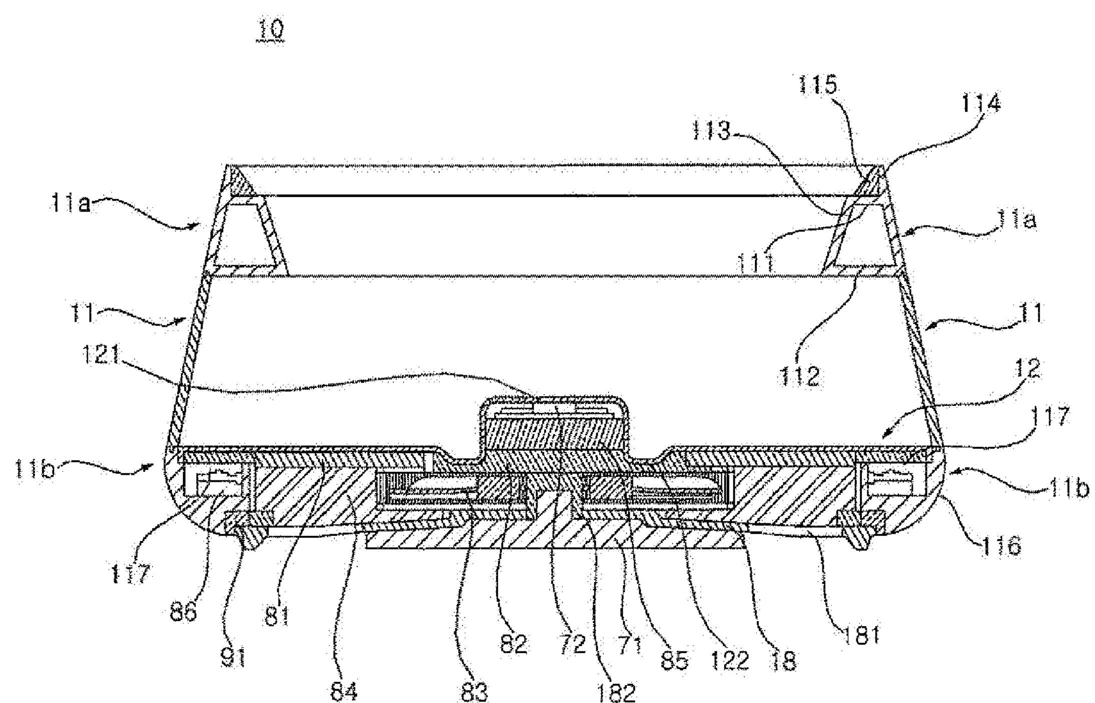
FIG. 3 is a side cross-sectional view showing the water tub shown in FIG. 2.

Referring to FIGS. 1 to 3, the water tub 10 may include a side wall being open up and down and forming the side edge of the water tub 10, and the floor plate 12 disposed under the open bottom of the side wall of the water tub 10.

The water tub 10 may be formed in a cylindrical shape tapered upward such that the inner diameter gradually decreases upward, as in an embodiment of the present disclosure, but is not limited thereto and may be formed in various shapes. When the water tub 10 is tapered upward, the water tub 10 can perform the function thereof while stably maintaining the position without overturning even if external shock of considerable magnitude is applied to the water tub 10.

The upper side wall 11*a* may extend upward from the main side wall 11 and the protrusive walls 111, 112, and 113 protruding toward the center of the water tub 10 may be formed on the inner surface of the upper side wall 11*a*.

The protrusive walls 111, 112, and 113 may have an inner inclined surface 113 on the inner surface. The inner inclined surface 113 may be inclined toward the center of the water tub as it goes down.

The protrusive walls 111, 112, and 113 may have a first protrusive plate 111 and a second protrusive plate 112 horizontally protruding toward the center of the water tub 10 on the inner surface of the upper side wall 11*a*. The protrusive plate 111 and the second protrusive plate 112 may be spaced up and down apart from each other. The protrusive plate 111 may be disposed over the second protrusive plate 112 and the second protrusive plate 112 may be disposed under the first protrusive plate 111.

An empty space is formed by the inner surface of the upper side wall 11*a*, the protrusive plate 111 and the second protrusive plate 112, and the inner inclined surface 113, so the weight of the water tub 10 can be reduced In particular, when the upper side wall 11*a* is made of an aesthetic expensive material, an empty space is formed by the inner surface of the upper side wall 11*a*, the protrusive plate 111 and the second protrusive plate 112, and the inner inclined surface 113, whereby the manufacturing cost of the upper side wall 11*a* can be reduced.

The second protrusive plate 112 may protrude inward further than the protrusive plate 111, and the inner inclined surface 113 may connect the inner end of the protrusive plate 111 and the inner end of the second protrusive plate 112.

The side wall 11*a* extends upward in the same direction as the main side wall 11, as in an embodiment of the present disclosure, whereby it may protrude from the main side wall 11 or may extend and protrude to gradually widens or narrow further than the main side wall 11.

The upper side wall 11*a* may have an upward protrusion 114 protruding upward from the first protrusive plate 111, and a packing 115 is attached to the inner surface of the upward protrusion 114 or the top of the first protrusive plate 111, whereby the water tray 50 can be disposed on the upper side wall 11*a* in close contact with the packing 115.

The packing 115 may be disposed on the inner surface of the side wall of the water tub 10 in close contact with the outer wall 51 of the water tray 50.

A protrusion 121 having a cylindrical shape and being convex upward may be formed at the center of the floor plate 12, a wireless power receiver 72 to be described below may be installed in the space inside the protrusion 121 when seen from the bottom of the floor plate 12, and the floor plate 12 may be integrated with the main side wall 11 or may be separately formed and integrated with the main side wall 11. A ring-shaped groove 122 being concave downward may be formed on the floor surface around the protrusion 121.

The main side wall 11 may be integrally made of the same material as the upper side wall 11*a* and the lower edge wall 11*b* or, the main side wall 11, the upper side wall 11*a*, and the lower edge wall 11*b* may be made of different materials and then combined. The main side wall 11 may be made of a material different from those of the upper side wall 11*a* and the lower edge wall 11*b*, and the upper side wall 11*a* and the lower edge wall 11*b* may be made of the same material. The upper side wall 11*a* and the lower edge wall 11*b* may be selectively made of various materials having an excellent aesthetic feeling, and the main side wall 11 may be made of a transparent material so that the amount of water in the water tub 10 can be recognized from the outside. In the embodiment, the main side wall 11 is made of glass, and the upper side wall 11*a* and the lower edge wall 11*b* are made of the same material which is stainless steel.

The lower edge wall 11*b* may have an outer circumferential surface 116 rounding downward from the lower edge of the main side wall 11.

The outer circumferential surface 116 may be convex outward.

Accordingly, when external shock is applied to the water tub 10 placed on the ground and the water tub 10 is inclined to a side, the water tub 10 can stand upright like a tumbling doll because the outer circumferential surface 116 comes in contact with the ground.

Further, the lower end of the outer circumferential surface 116 may be disposed close to the center of the water tub 10 in comparison to the upper end. Accordingly, when the water supplier is placed on the ground, a space is formed between the ground and the outer circumferential surface 116, so a user can insert fingers into the space formed between the ground and the outer circumferential surface 116 and can lift the water tub 10.

An edge surface 117 may protrude from the lower edge wall 11*b* to have a predetermined width toward the center of the tub 10 from the upper portion of the outer surface 116.

Accordingly, the outer circumferential surface 116 has the edge surface having a predetermined area overlapping the edge of the floor plate 12 and a water level sensor 86, etc. may be installed on the edge surface 117.

The main side wall 11, the upper side wall 11*a*, and the lower edge wall 11*b* may be integrally thermally bonded to one another.

A base 18 spaced downward apart from the floor plate 12 may cover the opening formed at the lower portion of the outer circumferential surface 116 of the lower edge wall 11*b*, various parts to be described below may be installed in the space formed by the lower edge wall 11*b*, the base 18, and the floor plate 12, and the base 18 may be disposed over a docking station 71 to be described below.

Figure 4:
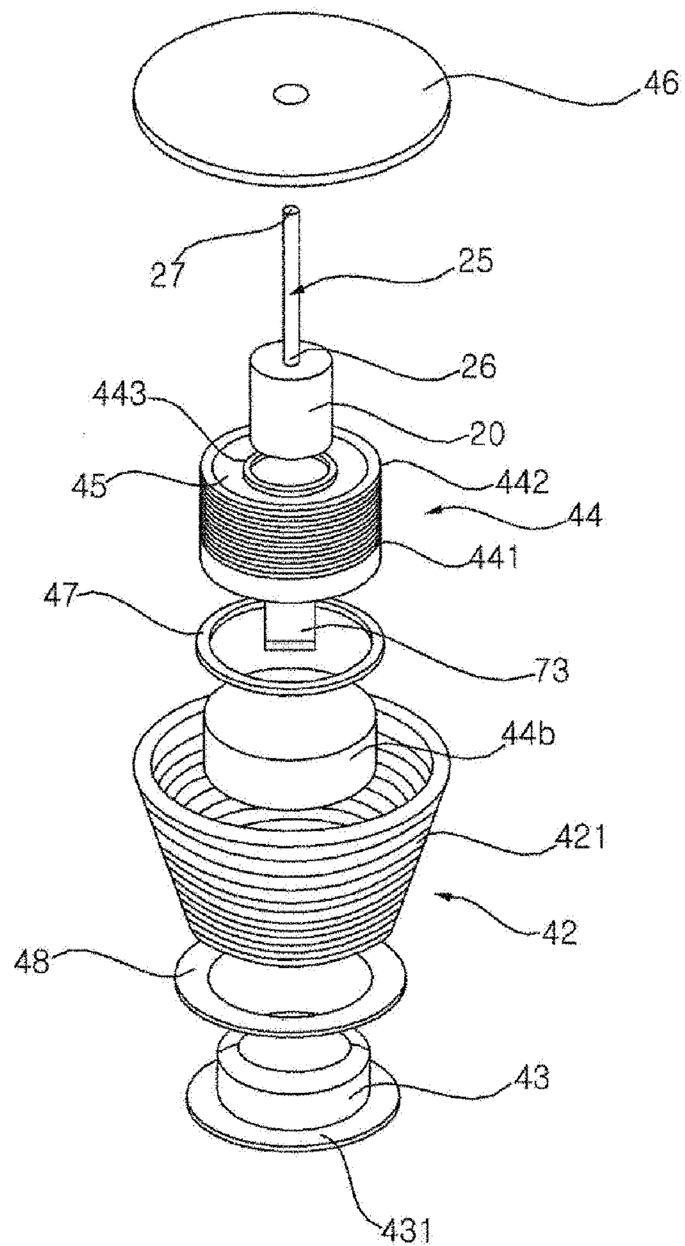
FIG. 4 is an exploded perspective view showing a filter, a pump, and a wireless power transmitter housing shown in FIG. 2.
Figure 5:
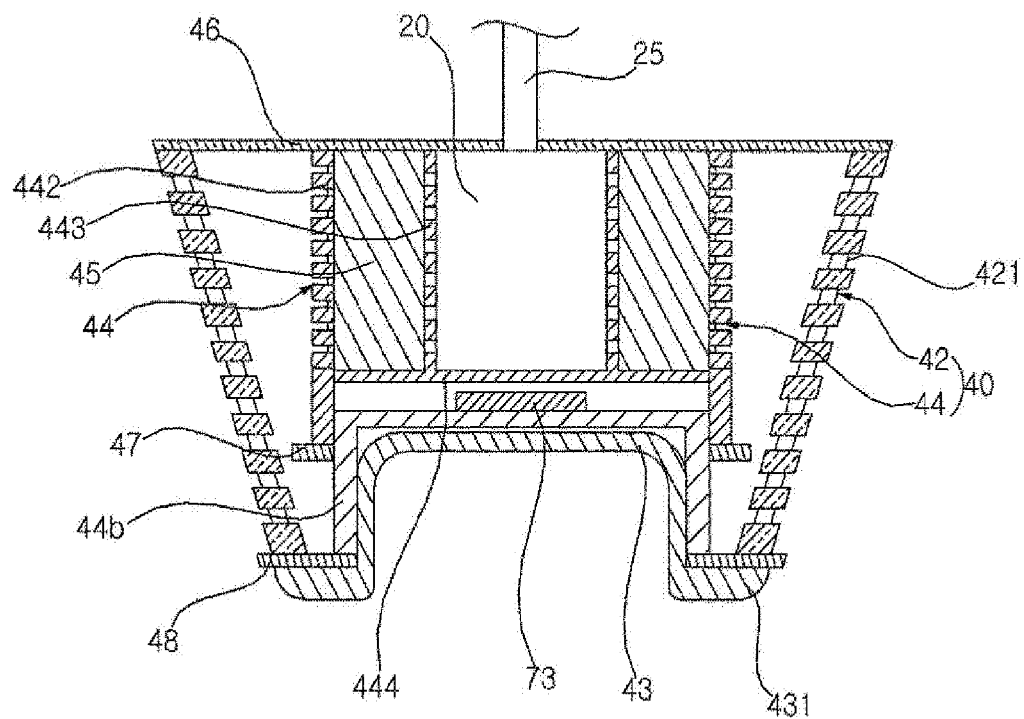
FIG. 5 is a side cross-sectional view showing the assembly of the filter, the pump, and the wireless power transmitter housing shown in FIG. 2.

Referring to FIGS. 2, 4, and 5, the filter 40 may include a first filter 42 and a second filter 44.

The first filter 42 is formed in a cylindrical shape having considerable rigidity and may have several holes 421 on the side wall. The first filter 42 may have a shape widening upward and may be made of stainless steel.

The first filter 42 can filter out foreign substances of which the particles are larger than the holes 421 of the first filter 42. For example, when a pet licks water collecting on the top of the water supply plate 30, food in the mouth of the pet may be dropped and mixed with the water stored in the water tub 10. Accordingly, the first filter 42 prevents foreign substances having larger particles than the holes 421 like the food mixed with the water stored in the water tub from passing through the holes 421, thereby being able to filter out the food from the water stored in the water tub 10.

The first filter 42 may be open up and down.

The first filter 42 may include a lower filter cover 43 disposed thereunder and the lower filter cover 43 may be separately formed and combined with the first filter 42 or may be formed as a single part with the first filter 42.

The lower filter cover 43 may be convex upward to be disposed over the protrusion 121 formed on the floor plate 12 of the water tub 10 described above and a flange 431 is formed at the edge of the lower filter cover 43, so as shown in FIG. 3, the flange 431 may be inserted into the groove 122 formed around the protrusion 121 of the floor plate 12.

Accordingly, the first filter 42 can be stably disposed at a predetermined position without horizontally moving in the water tub 10 by the protrusion 121 formed on the floor plate 12 and the lower filter cover 43 disposed over the protrusion 121.

The second filter 44 may be disposed in the space in the first filter 42 and the pump 20 may be installed in the internal space of the second filter 44.

When the pump 20 is installed in the internal space of the first filter 42 or the second filter 44, the filtering performance is increased and the pumping efficiency is improved, as compared with when a filter is disposed at a side of the pump. Further, there is no need for a specific components for fixing the pump at a predetermined position.

The second filter 44 may include a filter housing having an outer wall 442 having several holes 441 and an inner wall 443 spaced apart from the outer wall and having several holes, and a filtering material 45 provided in the space formed between the outer wall 442 and the inner wall 443 of the filter housing.

The filtering material 45 can filter out foreign substances having smaller particles than the holes 441 of the outer wall 442. The filtering material 45 may be a carbon filter.

Meanwhile, a support cylinder body 44*b* accommodating the wireless power receiver 73 may be disposed under the second filter 44.

The second filter 44 may have a support plate 444 supporting the bottom 45 of the filtering material 45 and the bottom of the pump 20, the side wall of the second filter 44 ma protrude downward further than the support plate 444, and the bottom of the second filter 44 may be open. The second filter 44 may be open up.

The support cylinder body 44*b* may be open on the bottom with the top closed. The lower filter cover 43 may be inserted into the lower opening of the support cylinder body 44*b*.

The lower end of the first filter 42 and the lower end of the outer wall 442 of the second filter 44 may be seated on the top of the flange 431 of the lower filter cover 43. In the embodiment, the second UV sterilization filter 48 is seated on the top of the flange 431, and the lower end of the first filter 42 and the lower end of the support cylinder body 44*b* are seated on the top of the second UV sterilization filter 48.

The upper end of the support plate 44*b* may be coupled to the lower end of the second filter 44. A spiral is formed on the inner circumferential surface of the lower end portion of the second filter 44 and a spiral that is engaged with the spiral of the second filter 44 is formed on the outer circumferential surface of the upper end portion of the support cylinder body 44*b*. Accordingly, when the upper end portion of the support cylinder body 44*b* is inserted into the lower end portion of the second filter 44, the spiral of the second filter 44 and the spiral of the support cylinder body 44*b* are engaged with each other, whereby the second filter 44 and the support cylinder body 44*b* may be combined with each other.

When the support cylinder body 44*b* is combined with the second filter 44, the wireless power receiver 73 may be seated on the top of the support cylinder body 44*b* and disposed in the space between the support plate 444 and the top of the support cylinder body 44*b*.

The pump 20 is disposed in the space formed inside the inner wall 443 of the second filter 44, and water that has passed through the first filter 42 and the filtering material 45 may be suctioned into the pump 20 through the holes formed on the inner surface 443 of the second filter 44 and discharged to the water supply pipe 25.

The first UV sterilization filter 47 having a ring shape may be installed on the upper outer circumferential surface of the support cylinder body 44*b*. The first UV sterilization filter 47 may include a plurality of first UV LEDs (not shown) circumferentially spaced apart from each other. The first UV sterilization filter 47 can sterilize the water flowing in the first filter 42 by diffusing the light generated by the first UV LEDs. The first UV LEDs may be circumferentially spaced apart from each other such that light is radiated radially outward to the inner circumferential surface of the first UV sterilization filter 47.

A second UV sterilization filter 48 having a ring shape may be installed under the first filter 42. The second UV sterilization filter 48 may be installed on the lower outer circumferential surface of the first filter 42. The second UV sterilization filter 48 may include a plurality of second UV LEDs (not shown) circumferentially spaced apart from each other. The second UV sterilization filter 48 can sterilize the water stored in the water tub 10 by diffusing the light generated by the second UV LEDs. The second UV LEDs may be circumferentially spaced apart from each other such that light is radiated radially outward to the inner circumferential surface of the second UV sterilization filter 48.

The first and second filters 42 and 44 may be covered with an upper filter cover 46 having the water supply pipe 25 passing therethrough, and closing the pump 20 and the tops of the first and second filters 42 and 44. The first and second filters 42 and 44 and the upper filter cover 46 may be integrally fixed to each other by bonding or thermal bonding or may be separably assembled by well-known coupling parts such as female and male hooks or threads that are engaged with each other.

The bottom of the support cylinder body 44*b* may be covered with the lower filter cover 43 described above. The support cylinder body 44*b* and the lower filter cover 43 may be manufactured as a single part.

When the lower filter cover 43 is integrally formed with the first filter 42 or may be combined with the first filter 42, the support cylinder body 44*b* may be disposed over the lower filter cover 43. On the other hand, when the lower filter cover 43 is integrally formed with the support cylinder body 44*b* or is combined with the support cylinder body 44*b*, the first filter 42 may be disposed over the lower filter cover 43.

The bottom of the support cylinder 44*b* may be directly fitted on the protrusion 121 on the floor plate or may be fitted on the lower filter cover 43 covering the protrusion 121 of the floor plate 12.

Only one of the first and second filters 42 and 44 may be disposed in the water tub 10 or a third filter not shown may be included.

The water supply pipe 25 is vertically disposed and may have a water inlet 26 at the lower end and an water outlet 27 at the upper end. Water discharged from the pump 20 may flow inside through the water inlet 26 and then may be discharged through the water outlet 27.

Referring to FIGS. 2, and 6 to 8, the water supply plate 30 may be a plate having a smooth top 31, may have a water supply hole 32 at the center and a boss 33 protruding downward, and the water supply hole 32 may extend through the boss 33.

The water supply hole 32 can supply water supplied from the water supply pipe 25 to the top 31 of the water supply plate 30.

The water moving to the top 31 of the water supply plate 30 through the water supply hole 32 may drop into the water tub 10 through the edge of the water supply plate 30. Since the water tray 50 receiving the water dropping from the edge of the water supply plate 30 and supplying the water into the water tub 10 is further provided in the embodiment, the water moving to the top 31 of the water supply plate 30 through the water supply hole 32 can drop to the water tray 50 through the edge of the water supply plate 30.

The water supply plate 30 may be formed in a disc shape in an embodiment of the present disclosure, but may be formed in other various shapes.

The top 31 of the water supply plate 30 may be a smooth surface of which the height increases toward the edge 311 from the center, an edge protrusion 312 slightly protruding downward may be formed at the edge 311, the upper portion of the water supply hole 32 may be formed such that the diameter gradually increases upward, and a nozzle cap 34 may be at least partially inserted into the water supply hole 32.

The nozzle cap 34 may include a stem 341, a plurality of stoppers 345 protruding outward from the stem 341 and circumferentially spaced apart from each other, and a head 342 formed at the top of the stem 341, and a head cover 343 widening upward may be formed at or coupled to the head 342.

The stem 341 of the nozzle cap 34 may be inserted into the water supply hole 32 such that the head cover 343 is slightly spaced upward apart from the water supply hole 32.

An end of the water supply 25 may be inserted into the water supply hole 32 or may be disposed under the water supply hole 32 such that the water outlet 27 communicates with the water supply hole 32.

The stoppers 345 protruding from the stem 341 of the nozzle cap 34 are in contact with the wall around the water supply hole 32, whereby the nozzle cap 34 can be supported at a predetermined position in the water supply hole 32.

Accordingly, water discharged from the water outlet 27 of the water supply pipe 25 hits against the upper portion of the nozzle cap 34 and is sprayed in a ring shape through the water supply hole 32, whereby it is supplied to the top 31 of the water supply plate. The water supplied to the center of the top 31 flows on the top 31 toward the edge 311 and then vertically drops from the edge 311.

Meanwhile, the water supply plate 30 may be a light guide plate made of stainless steel or a transparent or translucent material and may have a very small thickness.

The plate support 36 supporting the water supply plate 30 may be disposed under the water supply plate 30 and may be installed on a luminous body support 62 to be described below or on the light guide plate 63.

The plate support 36 may include an outer ring 361 being in contact with the outer side and the edge protrusion 312 of the water supply plate 30, a hub ring 362 disposed at the center, and a plurality of spokes 363 connecting the outer ring 361 and the hub ring 362. A boss 364 may protrude downward from the hub ring 362.

The boss 33 of the water supply plate 30 may be inserted into the hub ring 32 of the plate support 36 and a hole 365 formed at the boss 364, and a packing ring 37 may be forcibly inserted between the boss 33 formed at the water supply plate 30 and the boss 364 formed at the plate support 36.

The water supply pipe 25 may be disposed under the water supply plate 30 such that the water outlet 27 communicate with the water supply hole 32 of the water supply plate 30 through the partition plate 38 disposed under the plate support 36.

Meanwhile, a third UV sterilization filter 39 sterilizing water passing through the water supply pipe 25 or discharged from the water outlet 27 may be disposed around the water supply pipe 25. The third UV sterilization filter 39 may be a long cylinder elongated up and down. The upper end of the water supply pipe 25 may pass through the third UV sterilization filter 39.

The third UV sterilization filter 39 may include a plurality of third UV LEDs (not shown) circumferentially spaced apart from each other. The third UV sterilization filter 39 can sterilize the water discharged from the water outlet 27 of the water supply pipe 25 by diffusing the light generated by the third UV LEDs. The third UV LEDs may be circumferentially spaced apart from each other such that light is radiated upward to the bottom of the third UV sterilization filter 49.

A widening hole 331 may be formed at the lower portion in the water supply hole 32 formed at the boss 33 of the water supply plate 30, the upper portion 491 of the third UV sterilization filter 49 may be inserted into the widening hole 331, the packing ring 37 may be inserted between the boss 364 of the plate support 36 and the third UV sterilization filter 49, the lower portion of the third UV sterilization filter 49 may be disposed on the partition plate 38, and the water supply 25 may pass through the third UV sterilization filter 49.

The upper end of the third UV sterilization filter 49 may be disposed at the same position as the water outlet 27 that is the upper end of the water supply pipe 25 or may be disposed to cover a position higher than the water outlet 27 of the water supply pipe 25, whereby it is possible to improve sterilization effect by radiating UV light directly to the water discharged from the water outlet 27.

Meanwhile, a reinforcement ring 39 may be disposed on the bottom of the plate support 36 and may be supported by a reinforcement rib 621 of a luminous body support 62 to be described below.

The water supply plate 30 may be separably coupled to the inner assembly 100. That is, when the edge 311 of the water supply plate 30 is lifted, the water supply plate 30 is moved up against elasticity of the packing ring 37, whereby the water supply plate 30 can be separated from the plate support 36. Accordingly, the water supply plate 30 can be replaced with a water supply plate having a different shape or height.

The lighting device 60 may be installed under the water supply plate 30 and the plate support 36.

Figure 6:
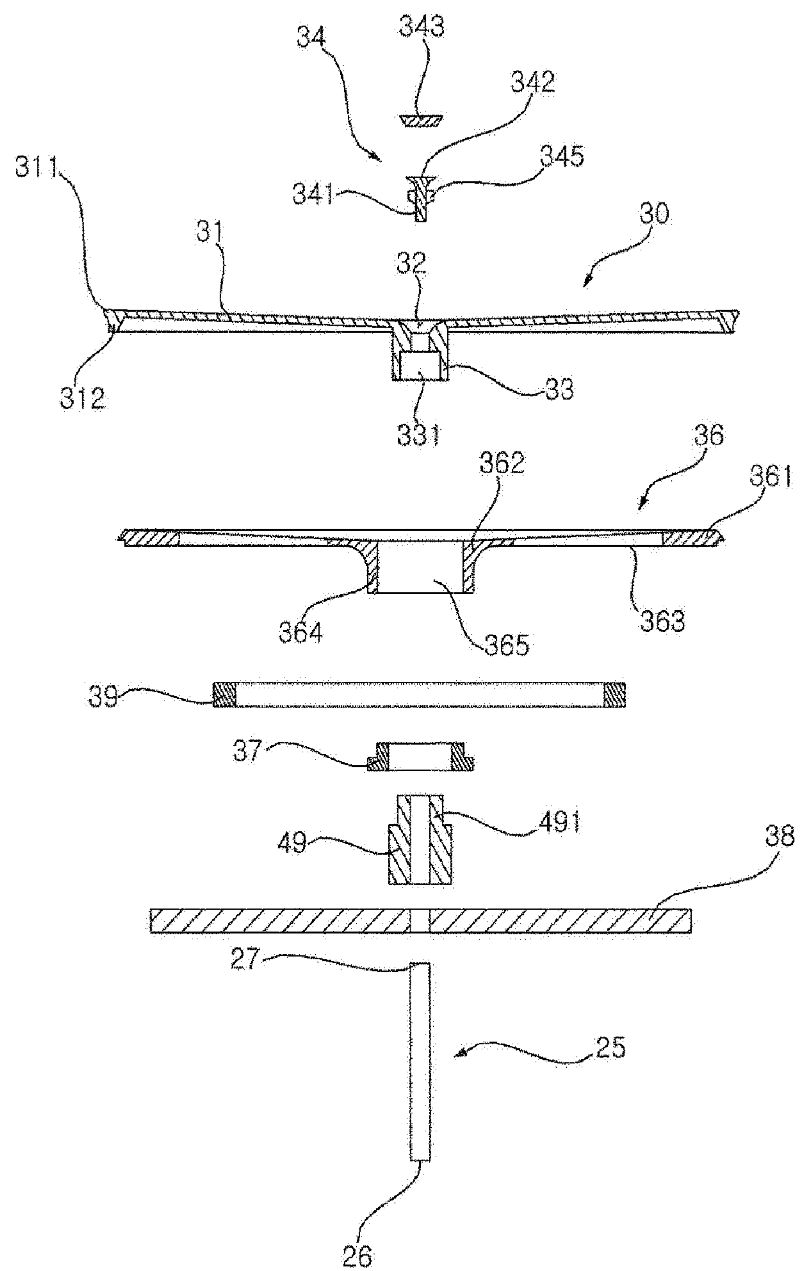
FIG. 6 is a view showing components that are assembled to the water supply plate shown in FIG. 2.
Figure 7:
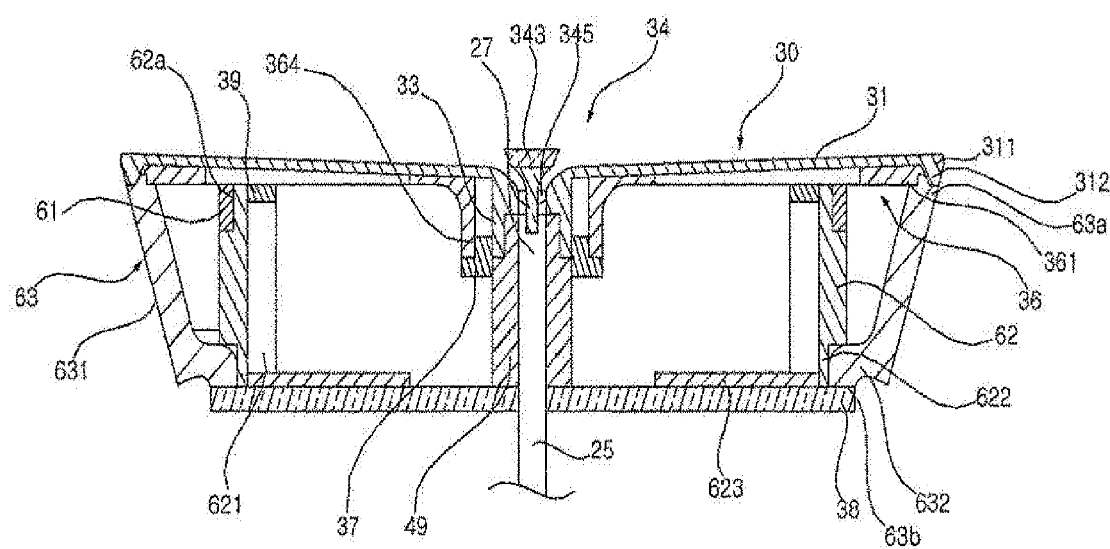
FIG. 7 is a side cross-sectional view showing the state in which the components shown in FIG. 6 and the lighting device are combined.
Figure 8:
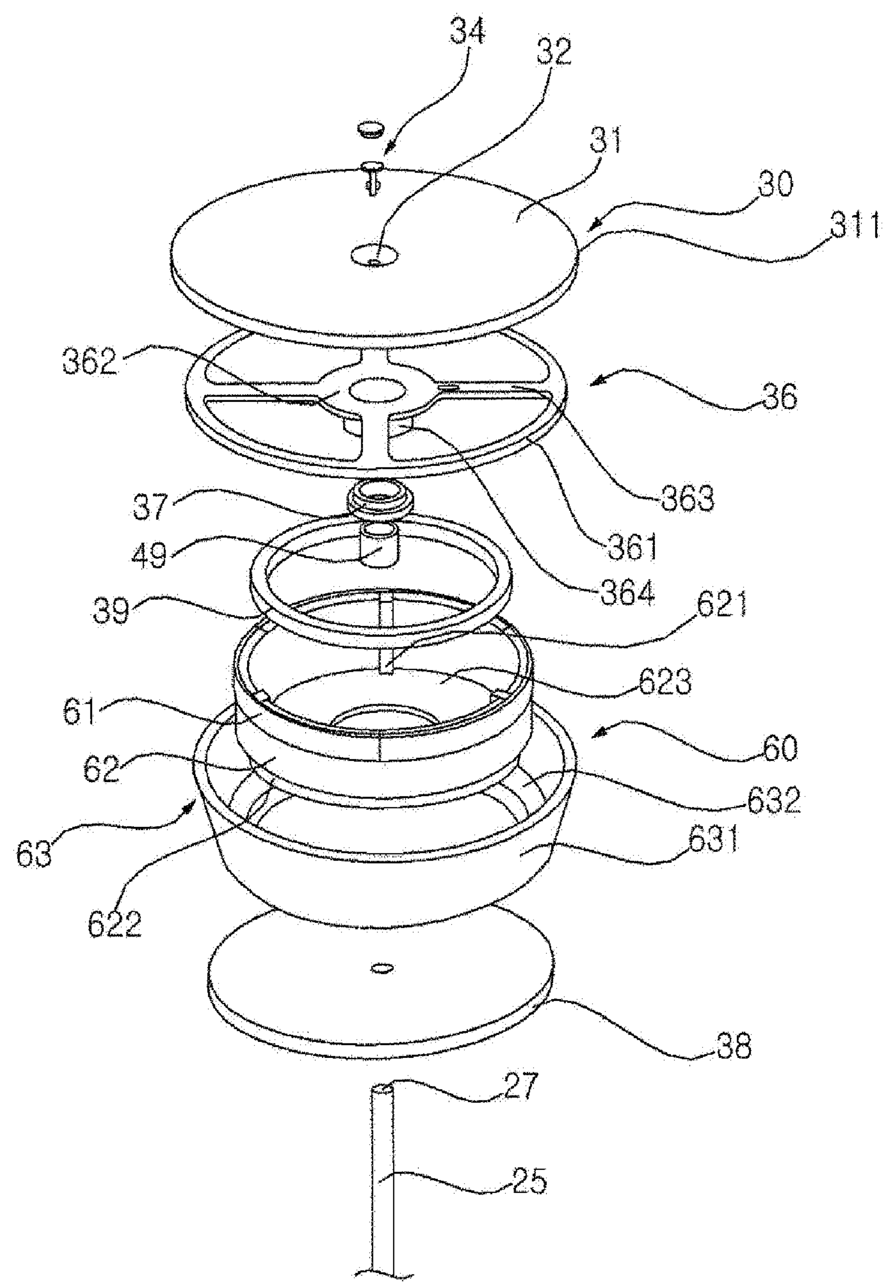
FIG. 8 is an exploded perspective view of FIG. 7.

Referring to FIGS. 2, 6, and 7, the lighting device 60 may include a luminous body 61, a support 62 on which the luminous body 61 is installed, and a light guide plate 63 disposed outside the luminous body support 62, in which the support 63 may be formed in a cylindrical shape.

The light guide plate 62 may be formed in a trumpet shape widening upward, the top 63*a* thereof, as shown in FIG. 7, may be in contact with the edge protrusion 312 of the water supply plate 30 and the outer ring 351 of the plate support 36 and the bottom 63*b* thereof may be in contact with the partition plate 38.

The outer surface 631 of the light guide plate 63 forms an inclined surface gradually recessed downward from the edge 311 of the water supply plate 30, so the water dropping from the edge 311 of the water supply plate 30 can vertically drop without hitting against the light guide plate 63.

The luminous body 61 may be composed of a plurality of light emitting diodes (LEDs) and may be attached to the luminous body support 62 to form an array having a predetermined shape, or may be formed by a band-shape light emitting diode and may be attached to the luminous body support 62 in a ring shape. The luminous body 61 may be inserted and attached into a recession 62*a* recessed inward and formed on the outer circumferential surface of the upper portion of the luminous body support 62.

The reinforcement rib 621 is formed on the inner surface of the luminous body support 62 and can the reinforcement ring 38. A recession 622 recessed inward is formed at the lower portion and an inward protrusion 631 formed at the lower end portion of the light guide plate 63 can be inserted thereinto. A PCB 623 controlling light emission of the luminous body 61 protrudes from the lower portion of the luminous body support 62 and may be disposed on the top of the partition plate 38.

The luminous body support 62, the light guide plate 63, and the partition plate 38 may be integrally bonded or thermally bonded or may be separably assembled.

Figure 9:
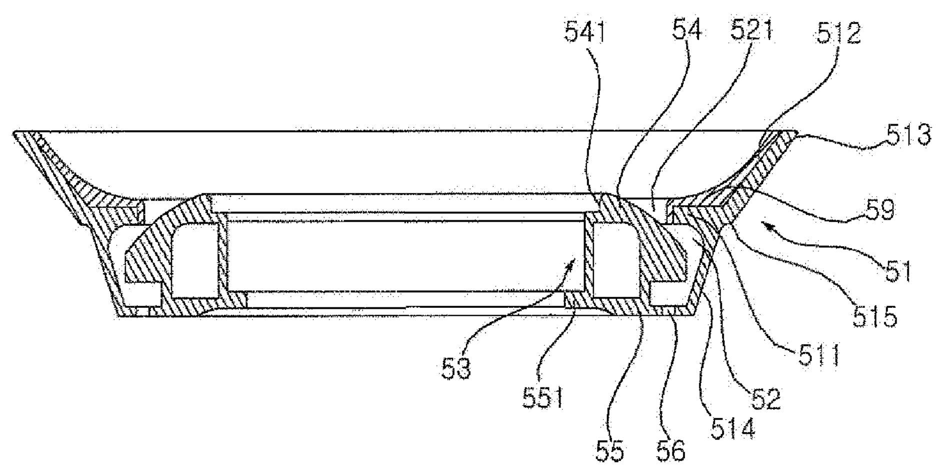
FIG. 9 is a side cross-sectional view showing a water tray shown in FIG. 2.

Referring to FIGS. 1, 2, and 9, the water tray 50 is positioned under the water supply plate 30 and is disposed to cover the open top of the water tub 10, thereby receiving the water dropping from the edge 311 of the water supply plate 30 and discharging the water to the water tub 10.

The water tray 50 may have an outer wall 51 forming an outer edge, an inner wall 53 forming an inner edge and forming a drain passage 52 between the outer wall 51 and the inner wall 53, and a floor wall 55 connecting the lower portions of the outer wall 51 and the inner wall 53.

A discharge hole 56 for discharging the water dropping to the water tray 50 from the water supply plate 30 to the water tub 10 may be formed in the floor wall 55. The discharge hole may be one or more ring-shaped or circular holes formed in the circumferential direction of the floor wall 55.

A guide 54 protruding toward the outer wall 51 and inclined downward is formed on the inner wall 53. The guide 54 can receive and guide downward the water supplied from the water supply plate 30. That is, the water dropping to the guide 54 from the water supply plate 30 can be guided downward along the guide 54. The guide 54 may be disposed lower than the upper end of the outer wall 51.

Although it is exemplified that the guide 54 is formed on the inner wall 53 of the water tray 50 in an embodiment of the present disclosure, the guide may be formed on the outer wall 51 of the water tray and may protrude toward the inner wall 53.

Referring to FIG. 2, the upper portion of the guide 54 may be in contact with the lower end of the light guide plate 63 and a groove 5*h*41 is formed in the upper portion of the guide 54, so the edge of the partition plate 38 is positioned in the groove 541 and then the light guide plate 63 may be disposed on the upper portion of the guide 54 and the edge of the partition plate 38.

The light guide plate 63, the water tray 50, and the partition plate 38 may be separably assembled by a well-known method or may be fixed to each other by bonding, thermal bonding etc. When the water tray 50 is separably assembled, the water tray 50 can be replaced with another water tray having a different shape or height.

Referring to FIG. 9, a protrusion 511 may be formed toward the guide 54 on the inner surface of the outer wall 51 of the water tray 50, the inner surface 512 of the outer wall extending upward from the protrusion 511 may be a widening inclined surface, and a narrow drain passage 521 may be formed between the protrusion 511 and the guide 54.

Accordingly, the water dropping to the water tray 50 from the water supply plate 30 may stay for a while on the guide 54 and the protrusion 511 and then may move downward through the drain passage 521.

A coating layer 59 made of a material different from the water tray 50 may be formed on the inner surface 512 of the upper portion of the outer wall 51 and on the top of the protrusion 511, the guide 54 may be made of a material different from the water tray 50 such that aesthetic feeling can be improved or the sense of touch can be made soft and the dropping water is prevented from flying by hitting against it.

The upper end of the outer wall 51 of the water tray may be higher than the inner wall 53, and as shown in FIG. 2, the outer wall 51 of the water tray has an upward protrusive wall protruding upward from the water tub 10, and the upward protrusive wall may protrude outward around the water tub 10. The upward protrusive wall may protrude upward from the upper side wall 11*a* of the water tub 10 and may protrude outward around the water tub 10 further than the upper side wall 11*a* and may widen further than the upper side wall 11*a*. The upward protrusive wall may make a predetermined angle θ outward together with the upper side wall 11*a*. The predetermined angle θ may be 120 degrees.

An upper inclined surface 513 and a lower inclined surface 514 that have different slopes may be formed on the outer surface of the outer wall 51 of the water tray 50. A step 515 may be formed between the upper inclined surface 513 and the lower inclined surface 514 on the outer surface of the outer wall 51 of the water tray 50.

The lower inclined surface 514 may be an outer inclined surface 514 supported by the inner inclined surface 113 of the water tub 10.

The step 515 of the water tray 50 may be seated on the tops of the protrusive walls 111, 112, and 113 formed on the upper side wall 11*a*. That is, the step 515 may be seated to be locked to the top of the first protrusive plate 111 formed on the upper side wall 11*a*.

The upper inclined surface 513 of the water tray 50 may be supported in contact with the packing 115 attached to the upper side wall 11*a*.

Accordingly, the water tray 50 may be hung on the upper side wall 11*a* and disposed firmly over the water tub 10.

A protrusive step 551 protruding inward from the inner wall 53 may be formed on the floor plate 55 of the water tray 50. The protrusive step 551 may be positioned over the edge of the upper filter cover 46 described above.

The protrusive step 551 may form the floor plate of the water tray 50 by protruding inward on the inner wall 53 of the water tray 50. The inside of the protrusive step 551 may be open. The upper filter cover 46 is coupled to the protrusive step 551, thereby being able to close the open inside of the protrusive step 551.

Referring to FIG. 2, an electronic part compartment S isolated from the water tub may be formed among the upper filter cover 46, the inner wall 53 of the water tray, and the partition plate 63, and an auxiliary battery B and a controller C may be installed in the electronic part compartment S.

The protrusive step 551 of the water tray 50 and the upper filter cover 46 may be separably combined by well-known coupling parts such as female and male hooks or threads that are engaged with each other, or may be fixed to each other by thermal bonding or bonding.

The filter 40, the pump 20, the water supply pipe 25, the water supply plate 30, the lighting device 60, and the water tray 50 may be integrally combined or assembled, thereby configuring the single inner assembly 100.

Accordingly, since the inner assembly 100 is detachably disposed in the water tub 10, it is possible to easily wash the water tub and maintain various parts by separating the inner assembly 100 from the water tub 100.

When the inner assembly 100 is installed in the water tub 10, the outer wall 51 of the water tray 50 positioned at the edge of the upper portion of the inner assembly 100 is locked to the upper side wall 11*a* of the water tub 10 and the lower filter cover 43 positioned at the lower center of the inner assembly 100 is fitted on the protrusion 121 formed on the floor plate 12 of the water tub and is inserted into the groove 122. Accordingly, the inner assembly 100 can be stably installed at a predetermined position without moving in the water tub 10. Further, it is possible to separate the inner assembly 100 from the water tub by holding and lifting the outer wall 51 of the water tray 50 upward from the water tub 10.

Next, a power supply device for operating the water supplier for a pet is described.

Figure 10:
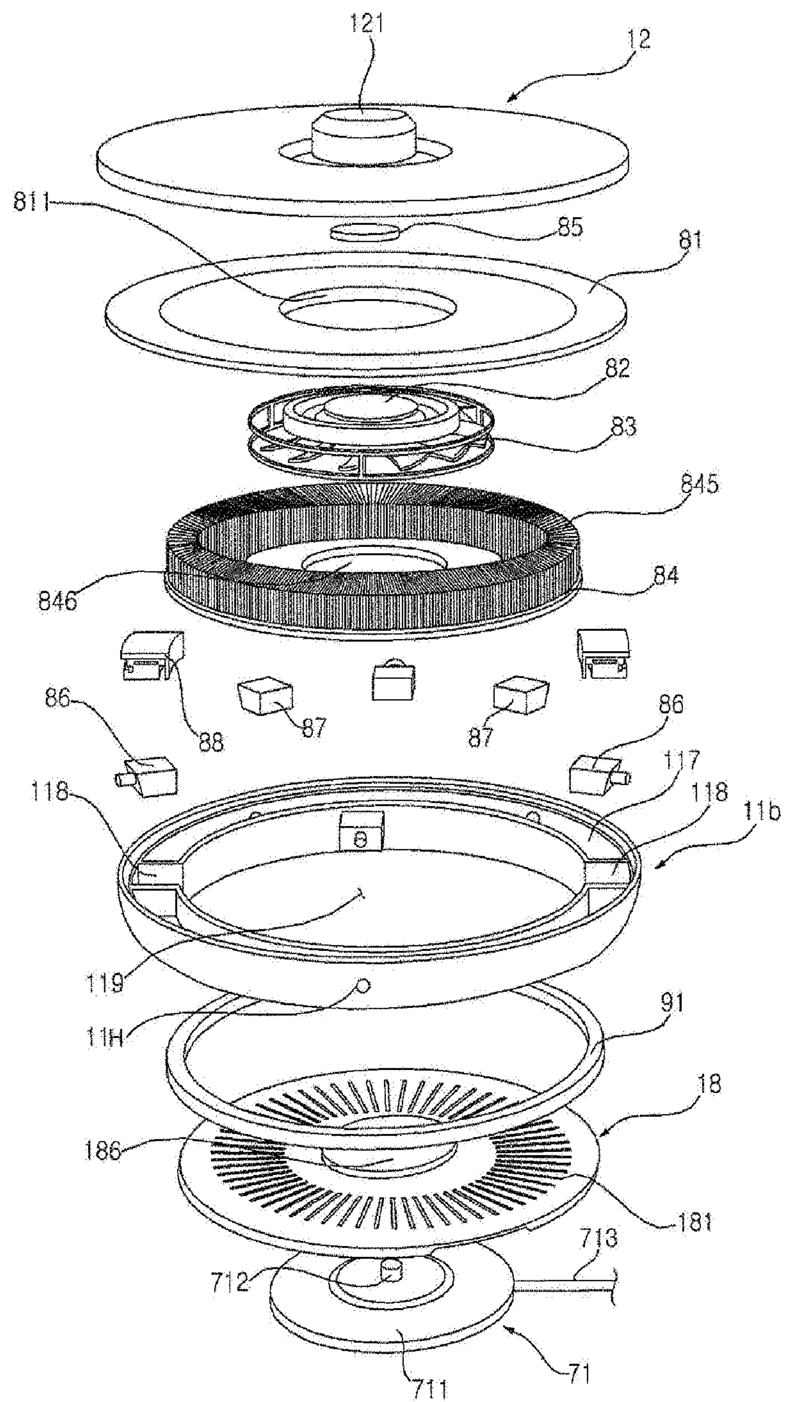
FIG. 10 is an exploded perspective view showing various components that are installed on a lower edge wall of the water tub.

Referring to FIGS. 3 and 10, the power supply device of the water supplier for a pet includes a docking station 71 and the docking station 71 may include a weight body 711 having considerably weight, a cylindrical protrusive rod 712 formed at the center of the weight body 711, a first connection terminal (not shown) disposed at the protrusive rod 712, and a wire 713 applying external power to the first connection terminal.

A circular groove 182 fitted on the protrusive rod 712 of the weight body may be formed on the bottom of the base 18 of the water tub and a second connection terminal (not shown) connected to the first connection terminal may be disposed in the circular groove 182.

The base 18 may be rotatably seated on the weight body 711 and the circular groove 182 is rotated fitted on the protrusive rod 712, so the first connection terminal and the second connection terminal may be disposed to keep being electrically connected even though the water tub 10 and the docking station 71 are relatively rotated.

Accordingly, even though the water tub 10 is rotated, power for operating the water supplier can keep being supplied without the wire 713 twisted.

A power circuit 715 electrically connected to the second connection terminal may be installed in the space formed among the floor plate 12 of the water tub 10, the base 118, and the lower edge wall 11*b*.

In an embodiment of the present disclosure, the wireless power transmitter 72 electrically connected to the power circuit 715 may be installed under the floor plate 12 of the water tub 10 and a wireless power receiver 73 generating an inductive voltage through induction with the wireless power transmitter 72 may be installed in the water tub 10.

The wireless power transmitter 72 is disposed in the space inside the protrusion 121 formed on the floor plate 12 and the wireless power receiver 73 is disposed between the lower filter cover 43 disposed over the protrusion 121 and the pump 20.

When the lower filter cover 43 is fitted on the protrusion 121 on the floor plate 12 and the inner assembly 100 is installed in the water tub 10, the wireless power receiver 73 should be disposed at a position where it can generate induction power by receiving wireless power from the wireless power transmitter 72.

Meanwhile, various parts installed in the space formed among the floor plate 12 of the water tub 10, the base 18, and the lower edge wall 11*b* of the water tub 10 are described hereafter with reference to FIGS. 2 and 10.

The base 18 can cover the lower portion of the lower edge wall 11*b*. The base 18 may be formed in a disc shape.

An insertion protrusion 186 may protrude from the top of the base 18. The insertion protrusion 186 may protrude upward from the center of the base 18. The insertion protrusion 186 may be formed in a circular shape.

A ventilation hole 181 may be formed at the base 18. A plurality of ventilation holes 181 may be vertically formed. The ventilation holes 181 may be circumferentially arranged around the base 18. The ventilation holes 181 may be spaced apart from the insertion protrusion 186.

An internal space 119 being open up and down may be formed inside the lower edge wall 11*b*. The lower edge wall 11*b* may be formed in a ring shape. The edge surface 117 may protrude from the inner surface of the lower edge wall 11*b*. The internal space 119 may be defined as a space that is positioned inside further than the edge surface 117.

The top of the edge surface 117 may be positioned under the upper end of the lower edge wall 11*b* and the bottom thereof may be positioned under the lower end of the lower edge wall 11*b*. The thermoelectric element 81 may be disposed on the top of the edge surface 117 and the floor plate 112 may be disposed on the top of the thermoelectric element 81. A ring-shaped warning lamp 91 may be installed on the bottom of the edge surface 117 and the base 18 may be disposed under the warning light 91.

The thermoelectric element 81 may cover the open top of the internal space 119. The base 18 may cover the open bottom of the internal space 119.

The thermoelectric element 81 may be disposed between the floor plate 12 and the base 18. The thermoelectric element 81 can cool or heat the water stored in the water tub 10.

The thermoelectric element 81 may be disposed under the floor plate 12 of the water tub 10. The thermoelectric element 81 can maintain the temperature of the water kept in the water tub 10 at a predetermined temperature.

When the thermoelectric element 81 is operated, the temperature of the top thereof may decrease and the temperature of the bottom thereof may increase. When the thermoelectric element 81 is operated, the top may be a heat absorption surface and the bottom may be a heat dissipation surface.

A heat dissipation plate 84 may be disposed in the internal space 119 of the lower edge wall 11*b*. A heating dissipation fan 83 may be disposed in the internal space 119 of the lower edge wall 11*b*. A motor 82 rotating the heat dissipation fan 83 may be installed between the floor plate 12 and the base 18.

The heat dissipation plate 84 may have a plurality of heat dissipation fins 845 protruding upward from the edge of the top. The tops of the heat dissipation fins 845 are in contact with the bottom that is the heat dissipation surface of the thermoelectric element 81, thereby being able to transfer the heat generated by the thermoelectric element 81 to the air around the heat dissipation fins 845.

The heat dissipation fins 845 may be circumferentially formed on the heat dissipation plate 84. The heat dissipation plate 84 is formed in a circular shape in the embodiment. Accordingly, the heat dissipation fins 845 are circumferentially formed on the heat dissipation plate 84, whereby the entire shape may be a ring shape.

The heat dissipation fan 83 may be disposed inside the heat dissipation fins 845. The heat dissipation fan 83 can suction air in the axial direction of the motor 82 and can discharge the air in the direction perpendicular to the axial direction. Accordingly, the heat dissipation fan 83 can axially suction air and then discharge the air toward the heat dissipation fins 845.

An insertion hole 846 is vertically formed through the center of the heat dissipation plate 84. The insertion protrusion 186 formed at the center of the base 18 is inserted into the insertion hole 846. As the insertion protrusion 186 is inserted into the insertion hole 846, the base 18 can be coupled to the heat dissipation plate 84. In order to firmly couple the base 18 to the heat dissipation plate 84, a hook that is locked to the top of the heat dissipation plate 84 when the insertion protrusion 186 is inserted into the insertion hole 846 may be formed at the insertion protrusion 186.

A hole 811 in which the motor 82 is installed may be formed in the thermoelectric element 81. The hole 811 may be formed at the center of the thermoelectric element 81. The heat dissipation fan 83 is disposed under the motor 82 and can be operated by the motor 82. The heat dissipation fins 845 may be installed around the heat dissipation fan 83.

Sensors are disposed at the lower portion of the water tub. In more detail, a water temperature sensor 85, a water level sensor 86, a proximity sensor, etc. are disposed inside the lower edge wall 11*b* forming the lower portion of the side wall 11. Similarly, an alarm 92 may be disposed on a portion of the lower edge wall 11*b*.

The water temperature sensor 85 may be further disposed between the floor plate 12 and the base 18. The water temperature sensor 85 can sense the temperature of the water stored in the water tub.

The water temperature sensor 85 may be installed in the internal space of the protrusion 112 of the floor plat 12 of the water tub 10. When the temperature of the water in the water tub 10 sensed by the water temperature sensor 85 is not within a setting range, the thermoelectric element 81 is operated and cools or heats the water and the heat of the thermoelectric element 81 can be dissipated through the heat dissipation plate 84.

When the temperature of the thermoelectric element 81 is higher than a reference temperature or the temperature of the heat dissipation plate 84 is higher than a predetermined temperature, the motor 82 is operated, thereby being able to rotate the heat dissipation fan 83.

When the heat dissipation fan 83 is rotated, external air is suctioned through the ventilation holes 181 formed at the base 18 and passes through the heat dissipation plate 84 and is then discharged back to the outside through the ventilation holes 181, so the heat dissipation plate 84 and the thermoelectric element 81 can be cooled.

Since the water temperature sensor 85 is installed in the protrusion 121 that is the part that comes in contact with the water stored in the water tub 10 through a large area of the floor plate 12 and through which water moves toward the pump 20, the water temperature sensor 85 can accurately sense the temperature of the water stored in the water tub 10.

The water level sensor 86 may be further disposed between the floor plate 12 and the base 18. A recessed groove 118 may be formed on the edge surface 117 of the lower edge wall 11*b* of the water tub 10 and the water level sensor 86 may be installed in the recessed groove 118.

The water level sensor 86 may be strain gauge that senses the weight of the water stored in the water tub 10 that is applied to the floor plate 12 of the water tub 10, and the water level in the water tub 10 can be determined on the basis of the weight of the water in the water tub 10 sensed by the strain gauge.

The proximity sensor 87 sensing a pet may be further disposed between the floor plate 12 and the base 18. The proximity sensor 87 may be disposed inside the lower edge wall 11*b*. The proximity sensor 87 may be disposed inside the edge surface 117. A signal fro the proximity sensor 87 is transmitted through a hole 11H formed in the lower edge wall 11*b* or a signal transmission film installed on the lower edge wall 11*b*, whereby a pet approaching the water supplier can be sensed.

When the proximity sensor 87 senses a pet, the controller C can operate the pump 20.

A plurality of proximity sensors 87 may be provided. The proximity sensors 87 can sense pets, respectively. When the proximity sensors 87 senses pets, respectively, the controller C determines that a plurality of pets approaches the water supplier and the pumping volume of the pump 20 can be increase in comparison to when one proximity sensor 87 senses a pet.

A gyro sensor 88 sensing the inclination of the water tub 10 may be further disposed between the floor plate 12 and the base 18. The gyro sensor 88 may be disposed inside the edge surface 117 of lower edge wall 11*b*. A plurality of gyro sensors 88 may be provided and can sense inclinations, respectively, and can determine the final inclination of the water tub 10 by averaging the sum of the sensed inclinations.

It is possible to measure the inclination, a variation of the inclination, an inclination direction, an inclination angle, etc. of the water tub 10 through the gyro sensor 88.

The controller C can turn on/off the water supplier by receiving a signal related to the inclination of the water tub 10 from the gyro sensor 88, can adjust the inclination and direction of the outlet of the water supply pipe 25, can adjust the inclination of the water supply plate 30, can turn on/off the warning lamp 91, and can generate an alarm through the alarm 92.

Meanwhile, though not shown in detail in an embodiment of the present disclosure, the water tub 10 has legs, which can be adjusted in height, on the bottom. When it is determined that the inclination of the water tub 10 sensed by the gyro sensor 88 is a predetermined value or more, the controller C can correct the inclination of the water tub 10 by adjusting the height of the legs.

The warning lamp 91 may be installed at the lower portion of the lower edge wall 11*b*, and when the water level in the water tub sensed by the water level sensor 86 is a predetermined value or less, the controller C can show this situation by turning on the warning lamp 91. Whether to turn on/off the warning lamp 91 may be determined on the basis of a signal from the controller by comparing the inclination sensed through the gyro sensor 88 with a predetermined setting value.

The warning lamp 91 may be a ring-shaped light emitting diode. The warning lamp 91 may be disposed under the edge surface 117.

The alarm 92 may be formed at a portion of the outer surface of the lower edge wall 11*b*. According to an embodiment of the present disclosure, the alarm 92 is disposed on the inner surface of the lower edge wall 11*b*, but is not limited thereto and may be disposed at any position on the water supplier as long as alarm generated by the alarm 92 can be aurally recognized at the outside. Whether to operate the alarm 92 may be determined on the basis of a signal from the controller by comparing the inclination sensed through the gyro sensor 88 with a predetermined setting value.

Figure 11:
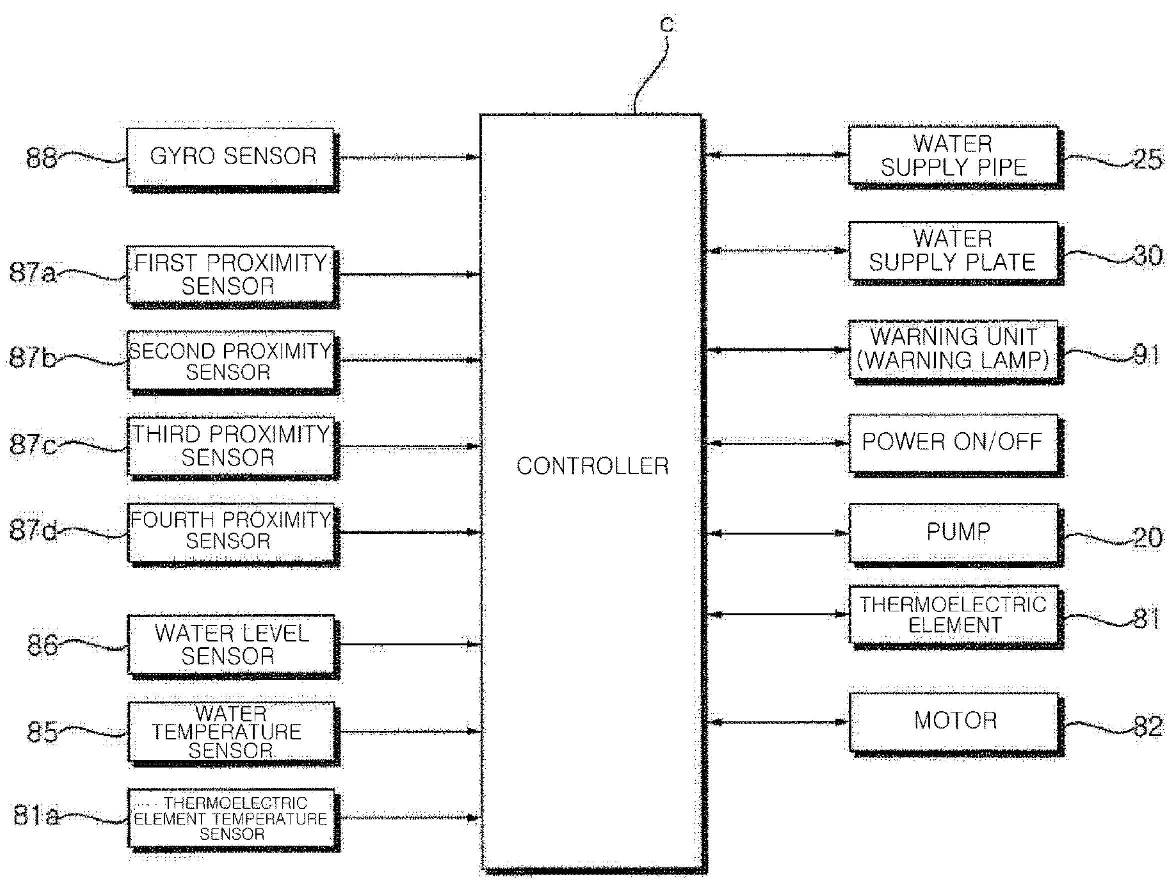
FIG. 11 is a control block diagram of device for controlling the water supplier for a pet according to the present disclosure.

Referring to FIGS. 10 and 11, the water temperature sensor 85 can sense the temperature of the water stored in the water tub 10. The water temperature sensor 85 can sense the temperature of the water stored in the water tub 10 and input the sensed water temperature value into the controller C, and the controller C can control the thermoelectric element 81 using the water temperature value input from the water temperature sensor 85.

The controller C receives the water temperature value from the water temperature sensor 85, and can operate the thermoelectric element 81 to cool the water when the temperature of the water stored in the water tub 10 sensed by the water temperature sensor 85 is a first water temperature setting value or more.

When the temperature of the water stored in the water tub 10 sensed by the water temperature sensor 85 is a second water temperature setting value or less, the controller C can stop the operation of the thermoelectric element 81 while the thermoelectric element 81 is operated. The first water temperature setting value may be a value higher than the second water temperature setting value and the second water temperature setting value may be a value lower than the first water temperature setting value.

A thermoelectric element temperature sensor 81*a* can sense the temperature of the thermoelectric element 81. The thermoelectric element temperature sensor 81*a* can sense the temperature of the internal space 119 of the lower edge wall 11*b*. The thermoelectric element temperature sensor 81*a* is limited to sense the temperature of the internal space 119 of the lower edge wall 11*b* in the following description, but the meaning that the thermoelectric element temperature sensor 81*a* senses the temperature of the internal space 119 is to sense the temperature of the internal space 119 due to the heat generated by the thermoelectric element 81, so it may be construed as the same meaning as that the thermoelectric element temperature sensor 81*a* senses the temperature of the thermoelectric element 81.

The thermoelectric element temperature sensor 81*a* can sense the temperature of the internal space 119 and can input the sensed temperature value of the internal space to the controller C, and the controller C can control the motor 82 using the temperature value of the internal space 119 input from the thermoelectric element temperature sensor 81*a*.

The thermoelectric element temperature sensor 81*a* may be disposed between the floor plate 12 of water tub 10 and the base 18. The thermoelectric element temperature sensor 81*a* may be disposed on the edge surface 117 protruding inside the lower edge wall 11*b*.

The controller C receives the temperature value of the internal space 119 from the thermoelectric element temperature sensor 81*a*, and operates the motor 82 to rotate the heat dissipation fan 83 when it is determined the temperature of the internal space 119 is a water temperature setting value, whereby the thermoelectric element 81 and the heat dissipation plate 84 can be cooled.

The controller C can stop the operation of the motor 82 when the temperature of the internal space 119 input from the thermoelectric element temperature sensor 81*a* is less than the water temperature setting value while the motor 82 is operated.

Figure 12:
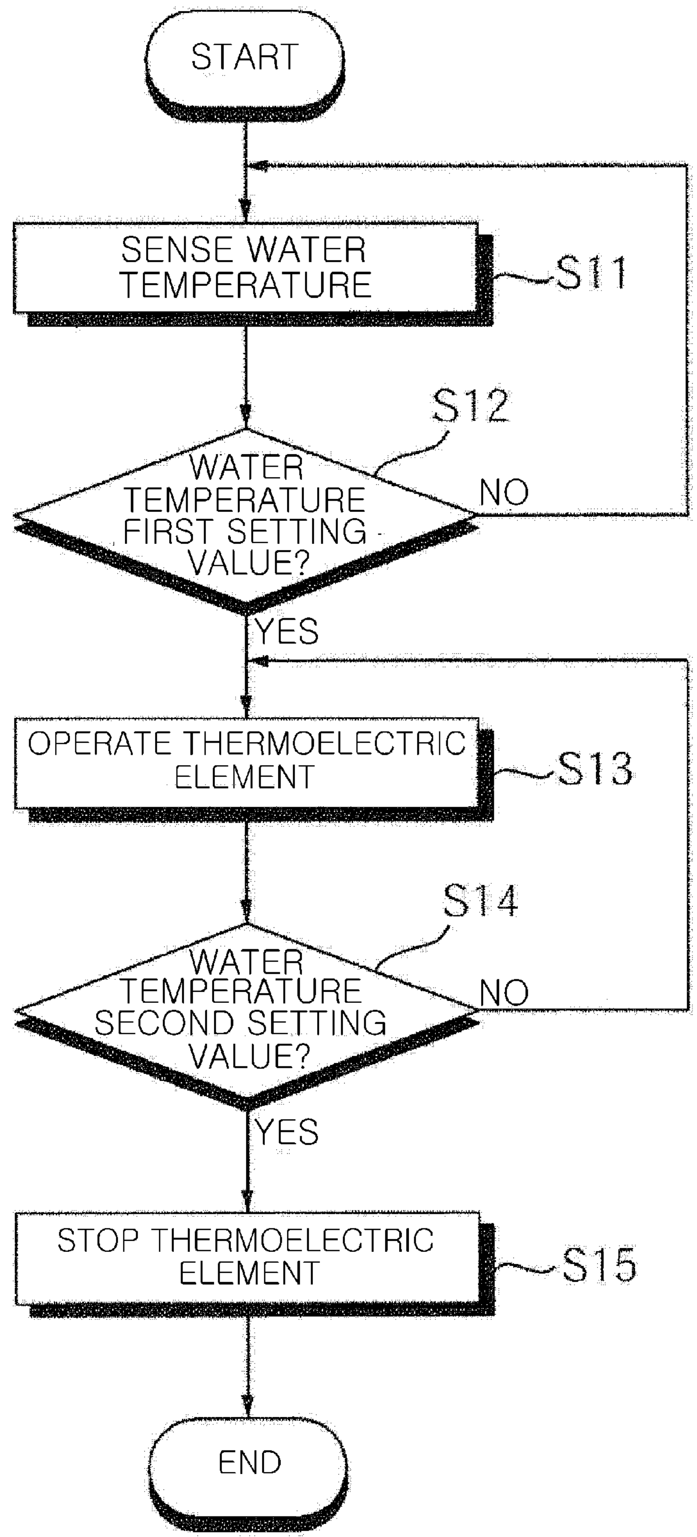
FIG. 12 is a flowchart showing a control method using a water temperature sensor of a water supplier for a pet according to a first embodiment of the present disclosure.

Referring to FIG. 12, according to a method of controlling the water supplier for a pet according to a first embodiment of the present disclosure, the water temperature sensor 85 senses the temperature of the water stored in the water tub

10 in a water temperature sensing step S11. The water temperature sensed by the water temperature sensor 85 is input to the controller C.

Thereafter, in a determining step S12, the controller C determines whether the water temperature sensed by the water temperature sensor 85 is the first water temperature setting value or more. That is, in the determining step S12, the controller C determines whether the water temperature input from the water temperature sensor 85 is the first water temperature setting value or more.

When the water temperature sensed by the water temperature sensor 85 is less than the first water temperature setting value as the result of the determining step S12, the controller C determines that the temperature of the water stored in the water tub 10 is a temperature suitable for a pet to drink the water and can return the logic to the water temperature sensing step S11.

Further, when the water temperature sensed by the water temperature sensor 85 is the first water temperature setting value or more as the result of the determining step S12, the controller C determines that the temperature of the water stored in the water tub 10 has increased to a temperature not suitable for a pet to drink the water and can operate the thermoelectric element 81. That is, in a thermoelectric element operating step S13, when the water temperature sensed by the water temperature sensor 85 is the first water temperature setting value or more, the controller C determines that the temperature of the water stored in the water tub 10 has increased to a temperature not suitable for a pet to drink the water and can operate the thermoelectric element 81.

Since when the thermoelectric element 81 is operated, the temperature of the top thereof decreases and the bottom thereof increases, the floor plate 12 of the water tub 10 being in contact with the top of the thermoelectric element 81 may decrease in temperature, and accordingly, the temperature of the water stored in the water tub 10 may decrease.

After the thermoelectric element operating step S13, the controller C can determine whether the water temperature sensed by the water temperature sensor 85 is the second water temperature setting value or less. That is, in a determining step S14, the controller C can determine whether the water temperature sensed by the water temperature sensor 85 is the second water temperature setting value or less.

When the water temperature sensed by the water temperature sensor 85 is larger than the second water temperature setting value as the result of the determining step S14, the controller C determines that the water stored in the water tub 10 has not been sufficiently cooled to a temperature suitable for a pet to drink the water and can return the logic to the thermoelectric element operating step S13.

Further, when the water temperature sensed by the water temperature sensor 85 is the second water temperature setting value or less as the result of the determining step S13, the controller C determines that the water stored in the water tub 10 has been cooled to a temperature suitable for a pet to drink the water and can stop the operation of the thermoelectric element 81. That is, in an thermoelectric element stopping step S15, when the water temperature sensed by the water temperature sensor 85 is the second water temperature setting value or less, the controller C determines that the water stored in the water tub 10 has been cooled to a temperature suitable for a pet to drink the water and can stop the operation of the thermoelectric element 81.

Figure 13:
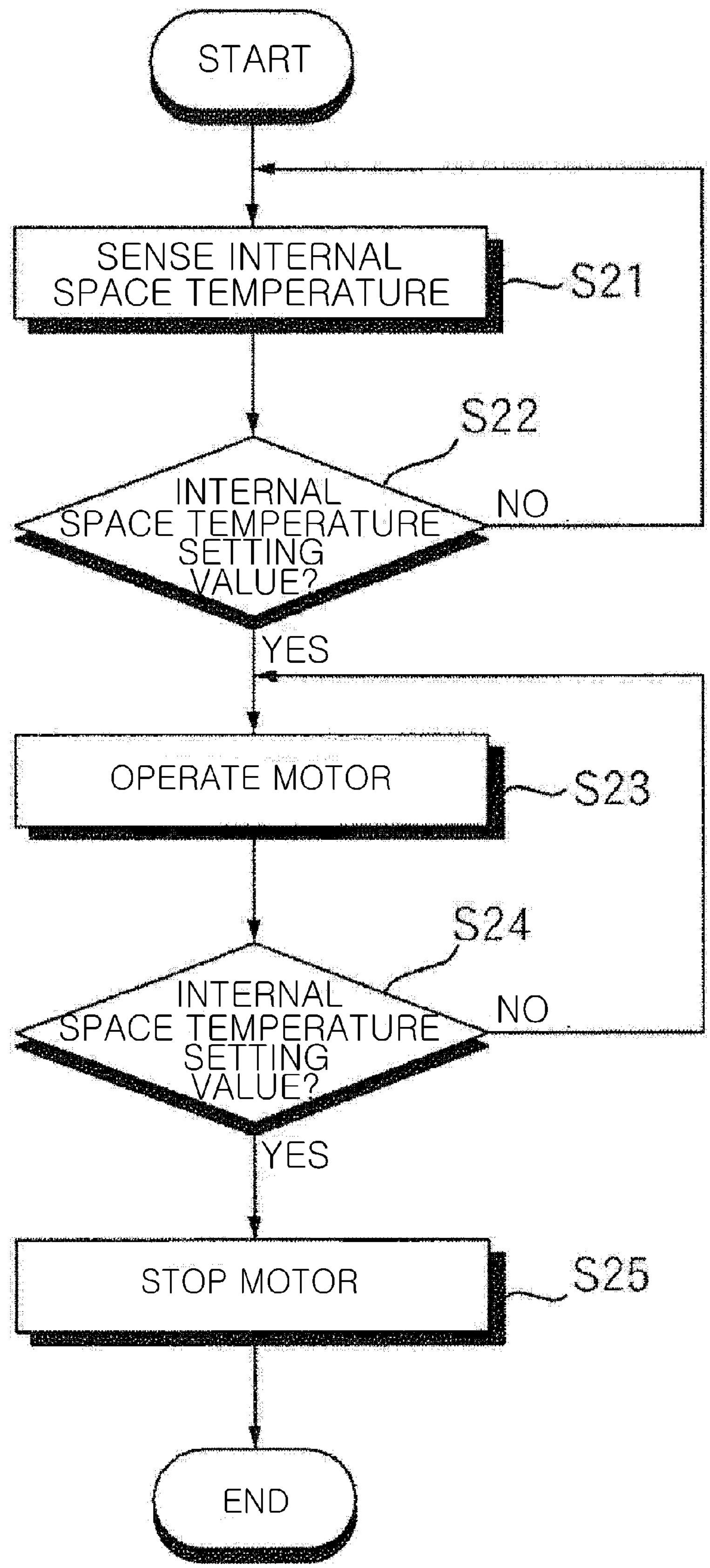
FIG. 13 is a flowchart showing a control method using a thermoelectric element temperature sensor of a water supplier for a pet according to a second embodiment of the present disclosure.

Referring to FIG. 13, according to a second embodiment of the present disclosure, the thermoelectric element temperature sensor 81*a* senses the temperature of the internal space 119 in an internal space temperature sensing step S21. The temperature of the internal space 119 sensed by the thermoelectric element temperature sensor 81*a* is input to the controller C.

Thereafter, in a determining step S22, the controller C determines whether the temperature of the internal space 119 sensed by the thermoelectric element temperature sensor 81*a* is a water temperature setting value or more. That is, in the determining step S22, the controller C determines whether the temperature of the internal space 119 input from the thermoelectric element temperature sensor 81*a* is the setting value or more.

As the result of the determining step S22, when the temperature of the internal space 119 sensed by the thermoelectric element temperature sensor 81*a* is less than the water temperature setting value, the controller C determines that a small amount of heat has been generated from the bottom of the thermoelectric element 81 and it is not required to discharge the heat of the internal space 119 to the outside, thereby being able to return the logic to the internal space temperature sensing step S21.

Further, as the result of the determining step S22, when the temperature of the internal space 119 sensed by the thermoelectric element temperature sensor 81*a* is the water temperature setting value or more, the controller C determines that a large amount of heat has been generated from the bottom of the thermoelectric element 81 and it is required to discharge the heat of the internal space 119 to the outside, thereby being able to operate the motor 82. That is, as in a motor operating step S23, when the temperature of the internal space 119 sensed by the thermoelectric element temperature sensor 81*a* is the setting value or more, the controller C determines that a large amount of heat has been generated from the bottom of the thermoelectric element 81 and it is required to discharge the heat of the internal space 119 to the outside, thereby being able to operate the motor 82.

When the motor 82 is operated, the heat dissipation fan 83 coupled to the rotary shaft of the motor 82 is rotated with the rotary shaft of the motor 82. The heat dissipation fan 83 blows air to the heat dissipation fins 845 being in contact with the bottom of the thermoelectric element 81 when rotating. Accordingly, the heat generated from the bottom of the thermoelectric element 81 may move to the heat dissipation fins 845, may transfer to the air of the internal space 119, and then may be discharged out of the water tub 10 through the ventilation holes 181 formed at the base 118.

After the motor operating step S23, the controller C can determine whether the temperature of the internal space 119 sensed by the thermoelectric element temperature sensor 81*a* is less than the setting value. That is, in the determining step S24, the controller C can determine whether the temperature of the internal space 119 sensed by the thermoelectric element temperature sensor 81*a* is less than the setting value.

As the result of the determining step S24, when the temperature of the internal space 119 sensed by the thermoelectric element temperature sensor 81*a* is not less than the setting value, the controller C determines that the internal space 119 has not been sufficiently cooled and can return the logic to the motor operating step S23.

Further, as the result of the determining step S24, when the temperature of the internal space 119 sensed by the thermoelectric element temperature sensor 81*a* is less than the setting value, the controller C determines that the internal space 119 has been sufficiently cooled and can stop the operation of the motor 82. That is, as in the motor stopping step S25, when the temperature of the internal space 119 sensed by the thermoelectric element temperature sensor 81*a* is the setting value more, the controller C determines that the internal space 119 has been sufficiently cooled and can stop the operation of the motor 82 and finish the logic.

Referring to FIGS. 10 and 11, the water level sensor 86 can sense the level of the water stored in the water tub 10. The water level sensor 86 can sense the level of the water stored in the water tub 10 and input the sensed water level value into the controller C, and the controller C can control the warning unit 91 using the water level value input from the water level sensor 86.

The controller C receives the water level value from the water level sensor 86, and can operate the warning unit 91 to inform a user of lack of water stored in the water tub 10 when the level of the water stored in the water tub 10 is a first water level value or less. The first water level value, which is a value set in advance in the controller C, may be a minimum water level.

When the level of the water stored in the water tub 10 sensed by the water level sensor 86 is a second water level value or more, the controller C can operate the warning unit 91 to inform a user that the water tub 10 is sufficiently supplemented with water when the user adds water into the water tub 10. The second water level setting value may be a value higher than the first water level setting value and the first water level setting value may be a value lower than the second water level setting value. The water level setting value, which is a value set in advance in the controller C, may be a maximum water level.

Figure 14:
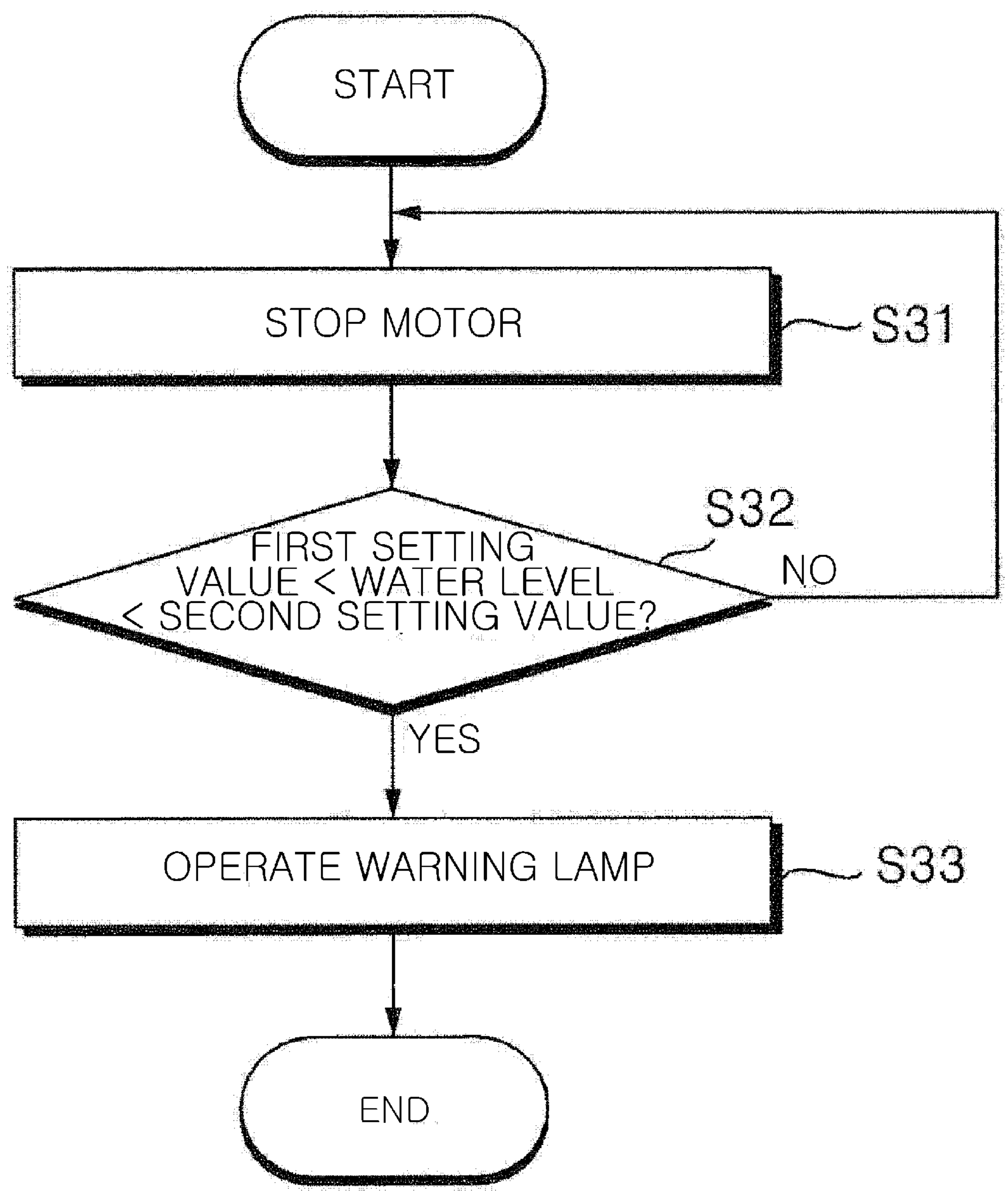
FIG. 14 is a flowchart showing a control method using a water level sensor of a water supplier for a pet according to a third embodiment of the present disclosure.

Referring to FIG. 14, according to a method of controlling the water supplier for a pet according to a third embodiment of the present disclosure, the water level sensor 86 senses the level of the water stored in the water tub 10 in a water level sensing step S31. The water level sensed by the water level sensor 86 is input to the controller C.

Thereafter, in a determining step S32, the controller determines whether the water level sensed by the water level sensor 86 is larger than the first water level setting value and smaller than the second water level setting value. That is, in the determining step S32, the controller C determines whether the water level input from the water level sensor 86 is larger than the first water level setting value and smaller than the second water level setting value.

As the result of the determining step S32, when the water level sensed by the water level sensor 86 is larger than the first water level setting value and smaller than the second water level setting value, the controller C determines that the water stored in the water tub 10 can be supplied to the top of the water supply plate 30 by the operation of the pump 20 at the water level, and can return the logic to the water level sensing step S31.

Further, as the result of the determining step S32, when the water level sensed by the water level sensor 86 is the first water level setting value or less, the controller C determines that the water stored in the water tub 10 cannot be supplied to the top of the water supply plate 30 even though the pump 20 is operated at the water level, and can operate the warning unit 91. That is, in a warning unit operating step S33, when the water level sensed by the water level sensor 86 is the first water level setting value or less, the controller C determines that the water stored in the water tub 10 cannot be supplied to the top of the water supply plate 30 even though the pump 20 is operated at the water level, and can operate the warning unit 91.

When the warning unit 91 is operated, a user can recognize lack of water stored in the water tub 10 and can add water into the water tub 10. The warning unit 91 may be a warning lamp, a speaker, or a vibrator, and the operation thereof was described above, so the operation of the warning unit 91 is no longer described in detail.

Further, as the result of determining step S32, when the water level sensed by the water level sensor 86 is the second water level setting value or more, the controller C determines that the water stored in the water tub 10 has reached the maximum water level, and can operate the warning unit 91. That is, as the result of the warning unit operating step S33, when the water level sensed by the water level sensor 86 is the second water level setting value or more, the controller C determines that the water stored in the water tub 10 has reached the maximum water level, and can operate the warning unit 91.

When the warning unit 91 is operated while the user adds water into the water tub 10, the user can recognize that the water stored in the water tub 10 has reached the maximum level and can stop adding water into the water tub 10.

Figure 15:
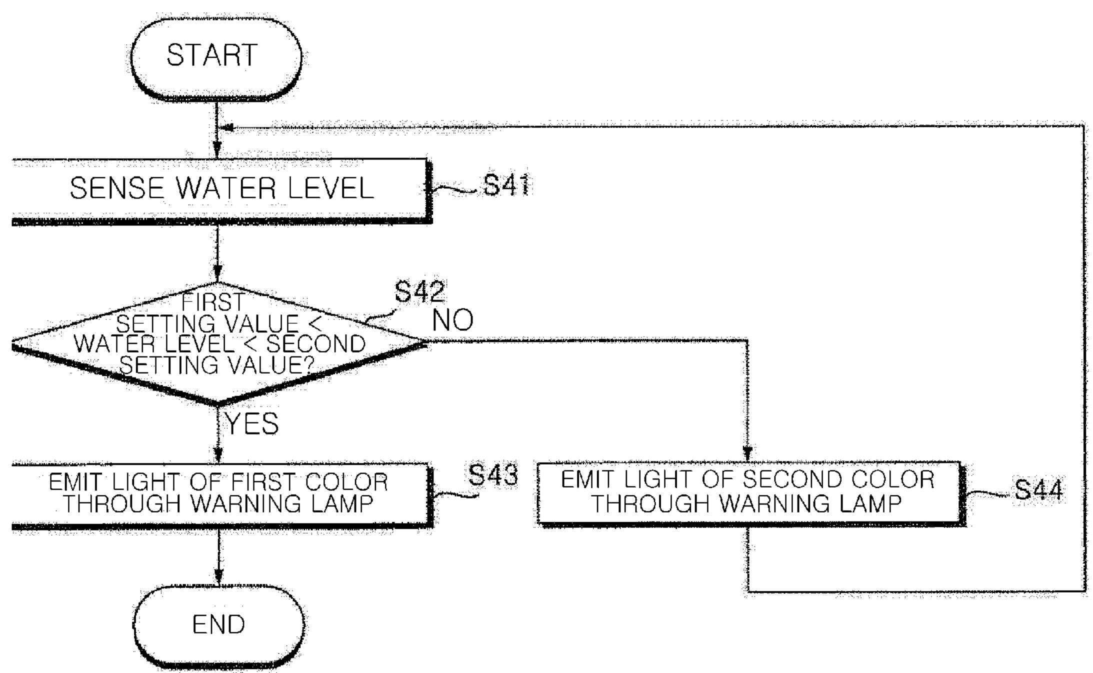
FIG. 15 is a flowchart showing a control method when a water level sensor of a water supplier for a pet according to a fourth embodiment of the present disclosure is used and a warning unit is a warning lamp.

A method of controlling the water supplier for a pet according to an embodiment of the present disclosure when the warning unit 91 is a warning lamp 91 is described hereafter with reference to FIG. 15.

Referring to FIG. 15, in a water level sensing step S41, the water level sensor 86 senses the level of the water stored in the water tub 10. The water level sensed by the water level sensor 86 is input to the controller C.

Thereafter, in a determining step S42, the controller C determines whether the water level sensed by the water level sensor 86 is larger than the first water level setting value and smaller than the second water level setting value. That is, in the determining step S42, the controller C determines whether the water level input from the water level sensor 86 is larger than the first water level setting value and smaller than the second water level setting value.

Further, as the result of the determining step S42, when the water level sensed by the water level sensor 86 is the first water level setting value or less, the controller C determines that the water stored in the water tub 10 cannot be supplied to the top of the water supply plate 30 even though the pump 20 is operated at the water level, and can control the warning lamp 91 to emit light of a first color. The first color may be red. That is, in a warning lamp-emitting first-color light S43, when the water level sensed by the water level sensor 86 is the first water level setting value or less, the controller C determines that the water stored in the water tub 10 cannot be supplied to the top of the water supply plate 30 even though the pump 20 is operated at the water level, and can control the warning lamp 91 to emit light of red that is the first color.

When the warning lamp 91 emits light of the first color, a user can recognize lack of water stored in the water tub 10 and can add water into the water tub 10.

Further, as the result of determining step S42, when the water level sensed by the water level sensor 86 is the second water level setting value or more, the controller C determines that the water stored in the water tub 10 has reached the maximum water level, and can control the warning lamp 91 to emit light of the first color. That is, in the warning lamp-emitting first-color light S43, when the water level sensed by the water level sensor 86 is the second water level setting value or more, the controller C determines that the water stored in the water tub 10 has reached the maximum water level, and can control the warning lamp 91 to emit light of red that is the first color. The second water level setting value may be a value larger than the first water level setting value.

When the warning lamp 91 emits light of red while the user adds water into the water tub 10, the user can recognize that the water stored in the water tub 10 has reached the maximum level and can stop adding water into the water tub 10.

Further, as the result of the determining step S42, when the water level sensed by the water level sensor 86 is larger than the first water level setting value and smaller than the second water level setting value, the controller C determines that the water stored in the water tub 10 can be supplied to the top of the water supply plate 30 by the operation of the pump 20 at the water level, and can control the warning lamp 91 to emit light of a second color. The second color may be a color different from the first color. The second color may be blue. That is, in a warning lamp-emitting second-color light S43, when the water level sensed by the water level sensor 86 is larger than the first water level setting value and smaller than the second water level setting value, the controller C determines that the water stored in the water tub 10 can be supplied to the top of the water supply plate 30 by the operation of the pump 20 at the water level, and can control the warning lamp 91 to emit light of blue that is the second color. The controller C can control the warning lamp 92 to emit light of blue that is the second color, and can return the logic to the water level sensing step S41.

When the warning lamp 91 emits light of the second color, the user can recognize that the water stored in the water tub 10 can be supplied to the top of the water supply plate 30 by the operation of the pump 20 at the water level.

As described above, according to the water supplier for a pet and a control method thereof of the present disclosure, when the level of the water stored in the water tub 10 sensed by the water level sensor 86 is the first water level setting value or less, the controller C determines that the water stored in the water tub 10 is insufficient and operates the warning unit 91, thereby being able to inform the user of lack of water.

Further, according to the water supplier for a pet and a control method thereof of the present disclosure, when the level of the water stored in the water tub 10 sensed by the water level sensor 86 is the second water level setting value, which is larger than the first water level setting value, or more, the controller C determines that the water tub 10 has been sufficiently supplemented with water and operates the warning unit 91, thereby being able to inform the user that the water has been supplied to the maximum water level.

Referring to FIGS. 10 and 11, a plurality of proximity sensors 87 can sense a pet approaching the water supplier for a pet. The proximity sensors 87 can sense a pet within a predetermined distance. The proximity sensors 87 can sense a pet within a predetermined distance and input a sensing signal to the controller C, and the controller C can control the pump 20 using the sensing signal input from the proximity sensors 87.

When at least one of the proximity sensors 87 senses a pet, the controller C can operate the pump 20. When the pump 30 is operated, the water stored in the water tub 10 can be supplied to the top of the water supply plate 30 through the water supply pipe 25. The pet can lick and drink the water supplied to the top of the water supply plate 30.

The reason that the controller C operates the pump 20 when at least one of the proximity sensors 87 senses a pet over a setting time is for operating the pump 20 only when determining that the pet has come close to the water supplier for a pet to drink water. That is, since a pet may just pass by the water supplier for a pet without approaching the water supplier for a pet to drink water, in order not to operate the pump 20 in this case, the controller C operates the pump 20 when at least one of the proximity sensors 87 senses a pet over the setting time.

The proximity sensors 87 may be spaced apart from each other around the water supplier for a pet. In the embodiment, the proximity sensors 87 are installed inside the lower edge wall 11*b*. However, the installation position of the proximity sensors 87 is not limited to the inside of the lower edge wall 11*b* and may be changed to various positions in the water supplier for a pet.

The proximity sensors 87 may be installed on the water tub. The proximity sensors 87 are limited as being installed inside the lower edge wall 11*b* in the following description.

The proximity sensors 87 may be spaced apart from each other around the lower edge wall 11*b*. Since the lower edge wall 11*b* is formed in a ring shape, the proximity sensors 87 may be spaced apart from each other around the lower edge wall 11*b*.

Four proximity sensors 87 are provided in the embodiment. However, the number of the proximity sensors 87 is not limited to four and two or more proximity sensors 87 may be provided around the lower edge wall 11*b*.

It is limited hereafter that four proximity sensors 87 are spaced apart from each other around the lower edge wall 11*b*.

The proximity sensors 87 includes a first proximity sensor 87A, a second proximity sensor 87B, a third proximity sensor 87C, and a fourth proximity sensor 87D.

The first proximity sensor 87A, the second proximity sensor 87B, the third proximity sensor 87C, and the fourth proximity sensor 87D may be sequentially arranged around the lower edge wall 11*b*. The first proximity sensor 87A, the second proximity sensor 87B, the third proximity sensor 87C, and the fourth proximity sensor 87D may be spaced apart from each other with regular intervals around the lower edge wall 11*b*. In the embodiment, the first proximity sensor 87A, the second proximity sensor 87B, the third proximity sensor 87C, and the fourth proximity sensor 87D may be spaced apart from each other with intervals of 90 degrees around the lower edge wall 11*b*. The first proximity sensor 87A and the third proximity sensor 87C may be positioned opposite to each other, and the second proximity sensor 87B and the fourth proximity sensor 87D may be positioned opposite to each other.

When any one of the first proximity sensor 87A, the second proximity sensor 87B, the third proximity sensor 87C, and the fourth proximity sensor 87D senses a pet over a setting time, the controller C determines that one pet has approached the water supplier for a pet to drink water, and can operate the pump 20 with a first pumping volume.

When all of the proximity sensors 87 do not sense a pet over the setting time while the pump 20 is operated, the controller C determines that the pet has finished drinking water and has moved away from the water supplier for a pet, and can stop the operation of the pump 20.

When the first proximity sensor 87A, the second proximity sensor 87B, the third proximity sensor 87C, and the fourth proximity sensor 87D do not sense a pet over the setting time, the controller C determines that the pet has finished drinking water and has moved away from the water supplier for a pet, and can stop the operation of the pump 20.

When the number of proximity sensors 87 that sense a pet over the setting time increases while the pump 20 is operated, the controller C determines that the number of pets approaching the water supplier for a pet to drink water has been increased, and can increase the pumping volume of the pump 20. The controller C can increase the pumping volume of the pump 20 by increasing the rotation speed of the rotor of the pump 20. Increasing the pumping volume of the pump 20 may the same meaning as increasing the rotation speed of the rotor of the pump 20.

When the number of proximity sensors 87 that sense a pet over the setting time decreases while the pump 20 is operated, the controller C determines that some of pets has moved away from the water supplier for a pet after finishing drinking water, and can decrease the pumping volume of the pump 20. The controller C can decrease the pumping volume of the pump 20 by decreasing the rotation speed of the rotor of the pump 20. Decreasing the pumping volume of the pump 20 may the same meaning as decreasing the rotation speed of the rotor of the pump 20.

For example, when two of the first proximity sensor 87A, the second proximity sensor 87B, the third proximity sensor 87C, and the fourth proximity sensor 87D sense a pet over a setting time while the pump 20 is operated, the controller C determines that two pets have approached the water supplier for a pet to drink water, and can operate the pump 20 with a second pumping volume.

Further, when three of the first proximity sensor 87A, the second proximity sensor 87B, the third proximity sensor 87C, and the fourth proximity sensor 87D sense a pet over a setting time while the pump 20 is operated, the controller C determines that three pets have approached the water supplier for a pet to drink water, and can operate the pump 20 with a third pumping volume larger than the second pumping volume.

Further, when all of the first proximity sensor 87A, the second proximity sensor 87B, the third proximity sensor 87C, and the fourth proximity sensor 87D sense a pet over a setting time while the pump 20 is operated, the controller C determines that four pets have approached the water supplier for a pet to drink water, and can operate the pump 20 with a fourth pumping volume larger than the third pumping volume.

The controller C can determine whether a pet has approached the water supplier within a predetermined distance range by receiving a signal from the proximity sensor 87, and can supply water by operating the pump 20 when determining that a pet has approached within the predetermined distance range, and can stop the operation of the pump 20 when determining that a pet has not approached within the predetermined distance range. The controller C can operate the pump 20 only when a pet stays within the predetermined distance range over setting time.

When receiving a signal from a plurality of proximity sensors 87 and determines that a plurality of pets has approached, the controller C can increase the pumping volume of the pump 20 to corresponding to the number of approaching pets so that water can be sufficiently supplied to all of the pets.

The controller C can continuously store the operation time of the pump 20 according to a signal from the proximity sensor 87, can analyze the operation time, can continuously determine the time at which a pet periodically drinks water and the amount of supplied water at that time, and can operate the pump 20 such that the determined amount of water is supplied at the time.

Figure 16:
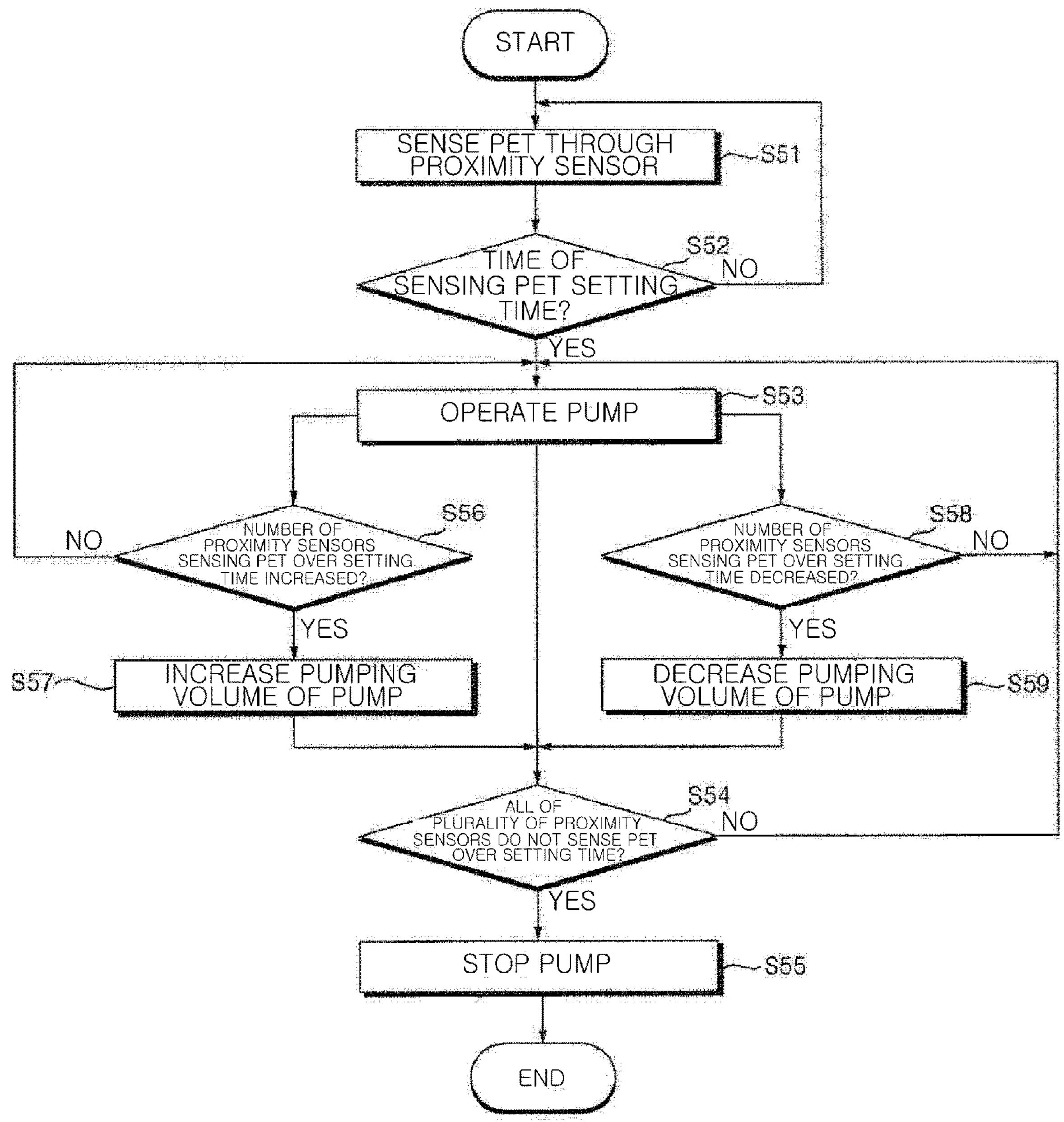
FIG. 16 is a flowchart showing a control method using a proximity sensor of a water supplier for a pet according to a fifth embodiment of the present disclosure.

Referring to FIG. 16, in a method of controlling a water supplier for a pet according to a fifth embodiment of the present disclosure, in a pet sensing step S51, at least one of the proximity sensors 87 senses a pet.

Thereafter, the controller C determines whether the time for which least one of the proximity sensors 87 senses the pet is setting time or more. That is, in a determining step S52, the controller C determines whether the time for least one of the proximity sensors 87 senses the pet is the setting time or more.

As the result of the determining step S52, when the time for least one of the proximity sensors 87 senses the pet is less than the setting time, the controller C determines that the pet has approached the water supplier for a pet for a short time and then has moved away from the water suppliers, and can return the logic to the pet sensing step S51.

Further, as the result of the determining step S52, when the time for least one of the proximity sensors 87 senses the pet is the setting time or more, the controller C determines that the pet stays to drink water after approaching the water supplier for a pet, and can operate the pump 20. That is, in a pump operating step S53, when least one of the proximity sensors 87 senses a pet over the setting time, the controller C determines that the pet stays to drink water after approaching the water supplier for a pet, and operates the pump 20. In other words, in the pump operating step S53, when the setting time passes after least one of the proximity sensors 87 starts the sense a pet, the controller C determines that the pet stays to drink water after approaching the water supplier for a pet, and operates the pump 20.

After the pump operating step S53, the controller C determines whether all of the proximity sensors 87 do not sense a pet over the setting time. That is, in a determining step S54, the controller C determines whether all of the proximity sensors 87 do not sense the pet over the setting time.

As the result of the determining step S54, when at least one of the proximity sensors 87 senses the pet over the setting time, the controller C determines that the pet keeps drinking water from the water supplier, and can return the logic to the pump operating step S53.

Further, as the result of determining step S54, when all of the proximity sensors 87 do not sense the pet over the setting time, the controller C determines that the pet has moved away from the water supplier for a pet after finishing drinking water from the water supplier for a pet, and stops the operation of the pump 20. That is, in a pump stopping step S55, when all of the proximity sensors 87 do not sense the pet over the setting time, the controller C determines that the pet has moved away from the water supplier for a pet after finishing drinking water from the water supplier for a pet, and stops the operation of the pump 20. In other words, in the pump stopping step S55, when setting time passes after the proximity sensors 87 do not sense the pet, the controller C determines that the pet has moved away from the water supplier for a pet after finishing drinking water from the water supplier for a pet, and can stop the operation of the pump 20 and finish the logic.

Meanwhile, after the pump operating step S53, the controller C determines whether the number of proximity sensors 87 that sense a pet over the setting time has increased. That is, in a determining step S56, the controller C determines whether the number of proximity sensors 87 that sense a pet over the setting time has increased.

As the result of the determining step S56, when the number of proximity sensors 87 that sense a pet over the setting time does not increase, the controller C determines that the number of pets coming to the water supplier for a pet has not increased, and can return the logic to the pump operating step S53.

Further, as the result of the determining step S56, when the number of proximity sensors 87 that sense a pet over the setting time increases, the controller C determines that the number of pets coming to the water supplier for a pet has increased, and can increase the pumping volume of the pump 20. That is, in a pump volume increasing step S57, when the number of proximity sensors 87 that sense a pet over the setting time increases, the controller C determines that the number of pets coming to the water supplier for a pet has increased, and can increase the pumping volume of the pump 20 and return the logic to the determining step S54.

Meanwhile, after the pump operating step S53, the controller C determines whether the number of proximity sensors 87 that sense a pet over the setting time has decreased. That is, in a determining step S58, the controller C determines whether the number of proximity sensors 87 that sense a pet over the setting time has decreased.

As the result of the determining step S58, when the number of proximity sensors 87 that sense a pet over the setting time does not decrease, the controller C determines that the number of pets coming to the water supplier for a pet has not decreased, and can return the logic to the pump operating step S53.

Further, as the result of the determining step S58, when the number of proximity sensors 87 that sense a pet over the setting time decreases, the controller C determines that the number of pets coming to the water supplier for a pet has decreased, and can decrease the pumping volume of the pump 20. That is, in a pump volume decreasing step S57, when the number of proximity sensors 87 that sense a pet over the setting time decreases, the controller C determines that the number of pets coming to the water supplier for a pet has decreased, and can decrease the pumping volume of the pump 20 and return the logic to the determining step S54.

As described above, according to the device and method for controlling the water supplier for a pet of an embodiment of the present disclosure, since a plurality of proximity sensors 87 is spaced apart from each other around the water supplier for a pet and senses pets within a predetermined distance range and the controller C operates the pump 20 when at least of the proximity sensors 87 senses a pet over setting time, the pump 20 is operated only when a pet stays over the setting time after approaching the water supplier for a pet, whereby power consumption can be reduced.

Further, according to the device and method for controlling the water supplier for a pet of an embodiment of the present disclosure, since the pumping volume of the pump 20 is adjusted in accordance with the number of proximity sensors that sense a pet over the setting time while the pump 20 is operated, it is possible to adjust the pumping volume of the pump 20 in accordance with the number of pets staying over the setting time after approaching the water supplier for a pet.

Figure 17:
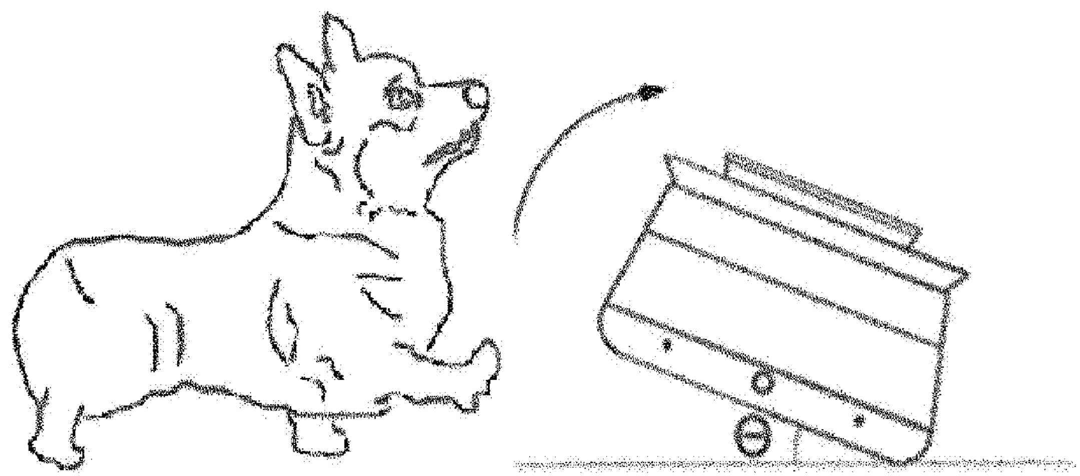
FIG. 17 is a view showing that a water supplier is inclined by a pet.
Figure 18:
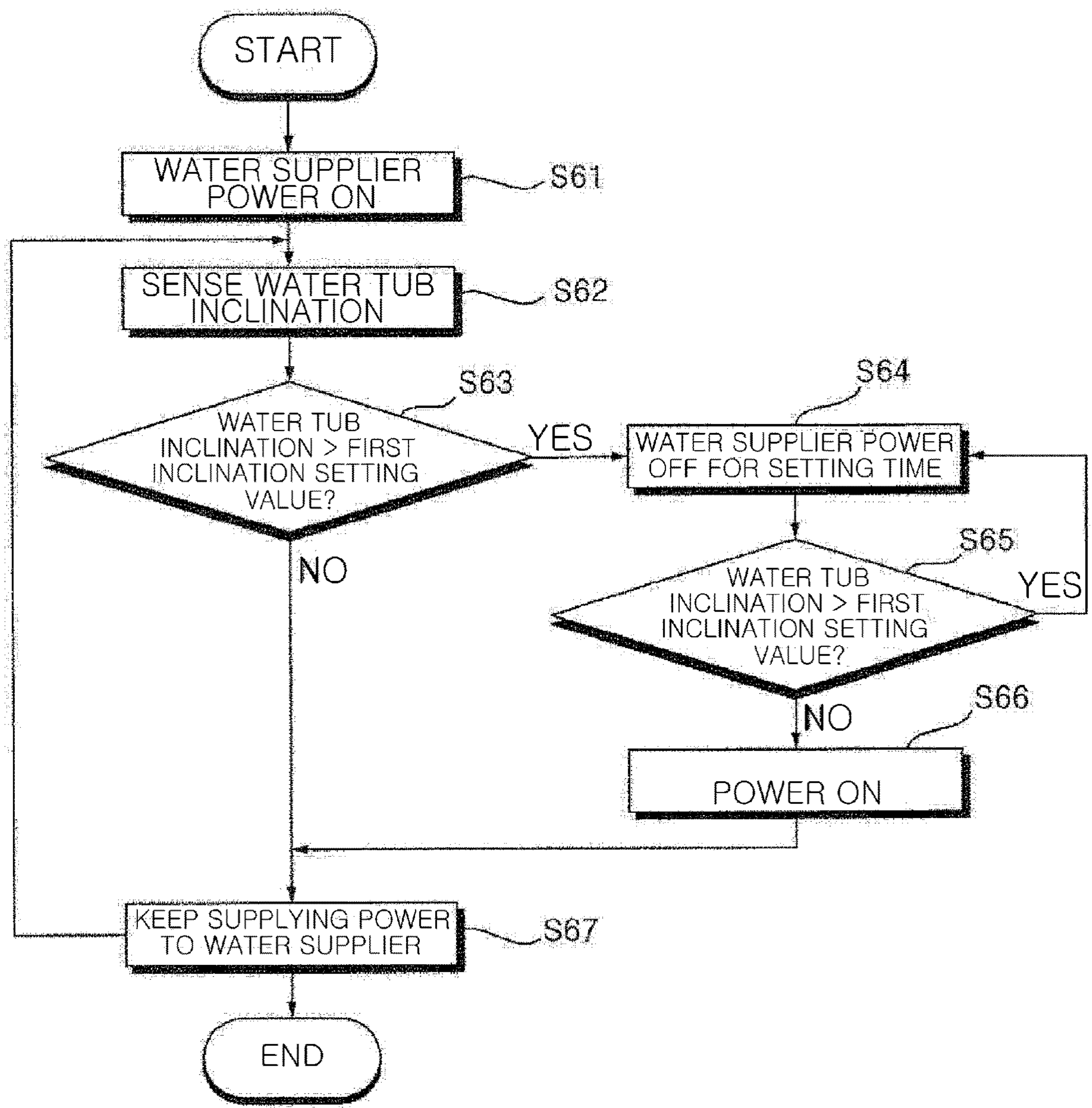
FIG. 18 is a flowchart showing a control method using a gyro sensor of a water supplier for a pet according to a sixth embodiment of the present disclosure.

Hereafter, a method of controlling a water supplier in accordance with the inclination of a water tub according to a sixth embodiment of the present disclosure is described with reference to FIGS. 17 and 18.

In general, it is required to consider the inclination of a water tub when a water supplier is seated on the ground and normally operate without external force. However, when force is applied to the water supplier by a pet, a user, or other external factors while water is supplied, an accident such as inclining or overturning of the water supplier may occur. Accordingly, when the position of the water supplier become unstable like this case, a pet at a position where it easily comes in contact with the water supplier may get shocked or there may be a danger of various injuries to the pet. Accordingly, a method of controlling a water supplier for maximally preventing such as danger is required.

As a plan against the case, the water supplier according to the present disclosure has been designed to sense the inclination of a water tub and cut the power for the water supplier when the water supplier is inclined much, thereby preventing a pet from getting shocked.

When the water supplier is turned on and water is being supplied through the pump 20 (S61), the gyro sensor 88 senses the inclination of the water tub 10 (S62) and transmits this situation to the controller C. The controller C determines whether the inclination of the water tub is larger than a predetermined first inclination setting value (S63).

The first inclination setting value may be a value at which the water supplier overturns when it exceeds the inclination setting value or may be a setting value at which a pet may get shocked due to considerable shaking of the water supplier while the water supplier returns to the initial position even though it does not overturn.

When the inclination of the water tub is smaller than the first inclination setting value, power keeps being supplied to the water supplier (S67), but when the inclination of the water tub is larger than the first inclination setting value, the power for the water supplier is cut for a predetermined setting time (S64) such that a pet do not get shocked.

After the setting time passes, the controller compares again the inclination of the water tub with the first inclination setting value (S65), cuts again the power for the water supplier for the setting time when the inclination of the water tub is larger than the first inclination setting value (S64), but supplies again power to the water supplier when the inclination of the water tub is smaller than the first inclination setting value (S66) so that water can be supplied again.

As described above, power is cut to prevent an electric shock and an injury of a pet, but when the water supplier has been already inclined at a considerable angle before inclining at the first inclination setting value, there is still the danger of an electric shock and an injury.

Accordingly, in order to solve the problems described above, according to a seventh embodiment of the present disclosure, when the water tub has been inclined at a second inclination setting value, which is smaller than the first inclination setting value, or more before power is cut, a warning lamp is turned on or an alarm is sounded to inform a pet or a user of the danger so that the pet or the user can avoid the danger of an electric shock or an injury.

Accordingly, a user and a pet are primarily warned of a danger by turning on a warning lamp or sounding an alarm when the second inclination setting value is reached, and power is cut when the water tub is inclined over the second inclination setting value and reaches the first inclination setting value, thereby securing two steps of protective means to prevent a pet.

Figure 19:
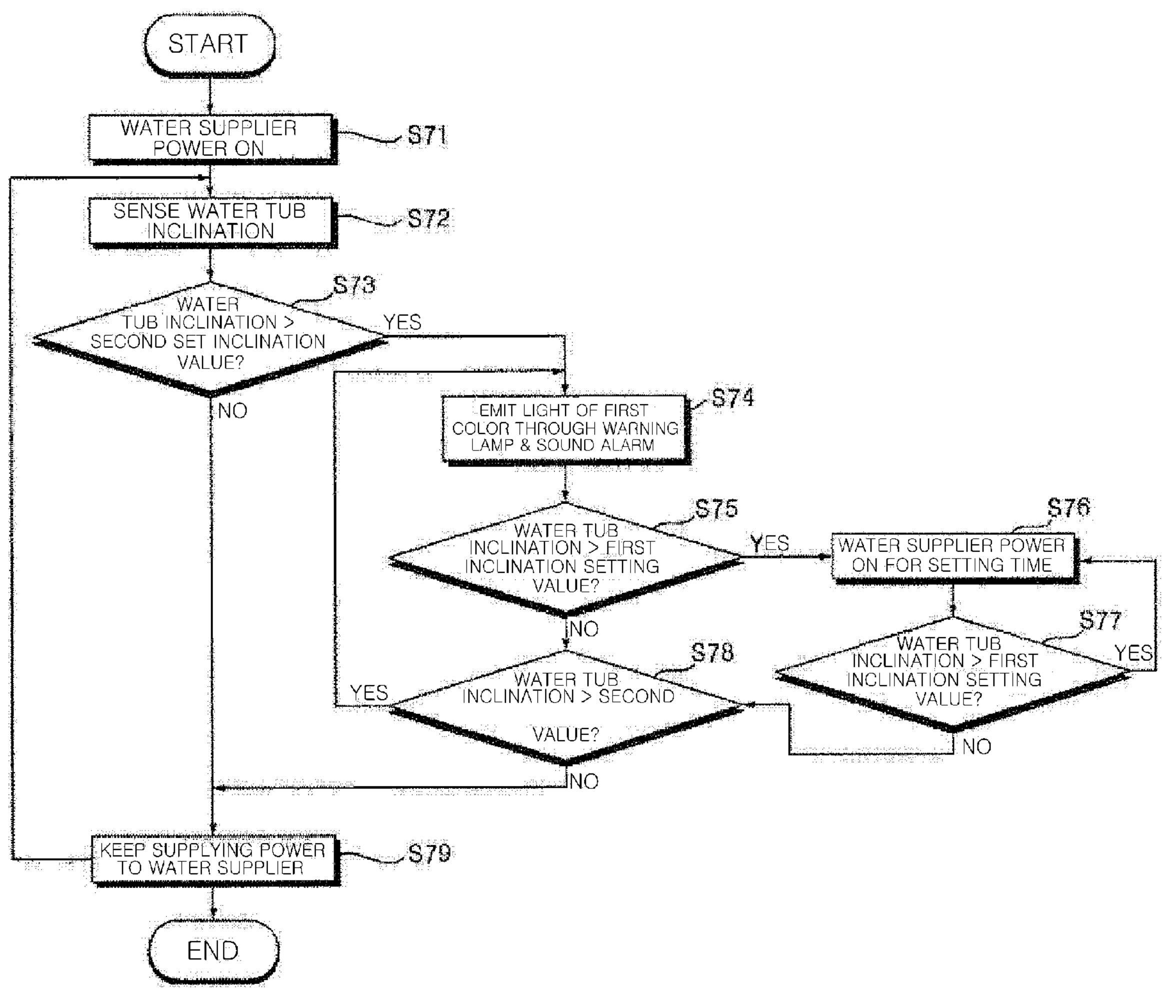
FIG. 19 is a flowchart showing a control method using a gyro sensor of a water supplier for a pet according to a seventh embodiment of the present disclosure.

Referring to FIG. 19, when the water supplier is turned on and water is being supplied through the pump 20 (S71), the gyro sensor 88 senses the inclination of the water tub 10 (S72) and transmits this situation to the controller C. The controller C determines whether the inclination of the water tub is larger than a predetermined second inclination setting value (S73).

The second inclination setting value is set as an inclination smaller than the first inclination setting value and is smaller than the first inclination setting value, but is set as an inclination that can minimize the danger of an electric shock or the danger of an injury of a pet.

When the inclination of the water tub is larger than the second inclination setting value, the warning lamp 91 may be turned on to emit light of the first color or alarm may be generated through the alarm 92 (S74). The first color and the alarm may be a color and a sound that enable a pet to recognize a danger.

When it is determined that the inclination of the water tub is larger than the first inclination setting value after the warning lamp is turned and the alarm is generated (S75), power for the water supplier is cut for setting time (S76). The warning lamp and the alarm may not be operated after power is cut, or the warning lamp and the alarm may be operated by an auxiliary power device even after power is cut.

When the inclination of the water tub is smaller than the first inclination setting value, whether the inclination is larger than the second inclination setting value is determined (S78). In this case, when the inclination of the water tub is larger than the second inclination setting value, the warning lamp can be turned on and alarm can be generated through the alarm (S74). When the inclination of the water tub is smaller than the second inclination setting value, power keeps being supplied to the water supplier (S79).

After power for the water supplier is cut for setting time (S76), the controller C determines again the inclination of the water tub, cuts again the power for the water supplier for the setting time when the inclination of the water tub is larger than the first inclination setting value (S77), and determines whether the inclination of the water tub is larger than the second inclination setting value when the inclination of the water tub is smaller than the first inclination setting value (S78). When the inclination of the water tub is larger than the second inclination setting value, the warning lamp can be turned on and alarm can be generated (S74), and when the inclination of the water tub is smaller than the second inclination setting value, power keeps being supplied to the water supplier (S79).

Cutting and re-supplying of power can be performed by opening and closing a switch installed in a circuit constituting the wireless power transmitter 72 and the wireless power receiver 73.

The configuration excepting for the control method according to a seventh embodiment of the present disclosure is the same as the configuration according to the sixth embodiment of the present disclosure.

Figure 20:
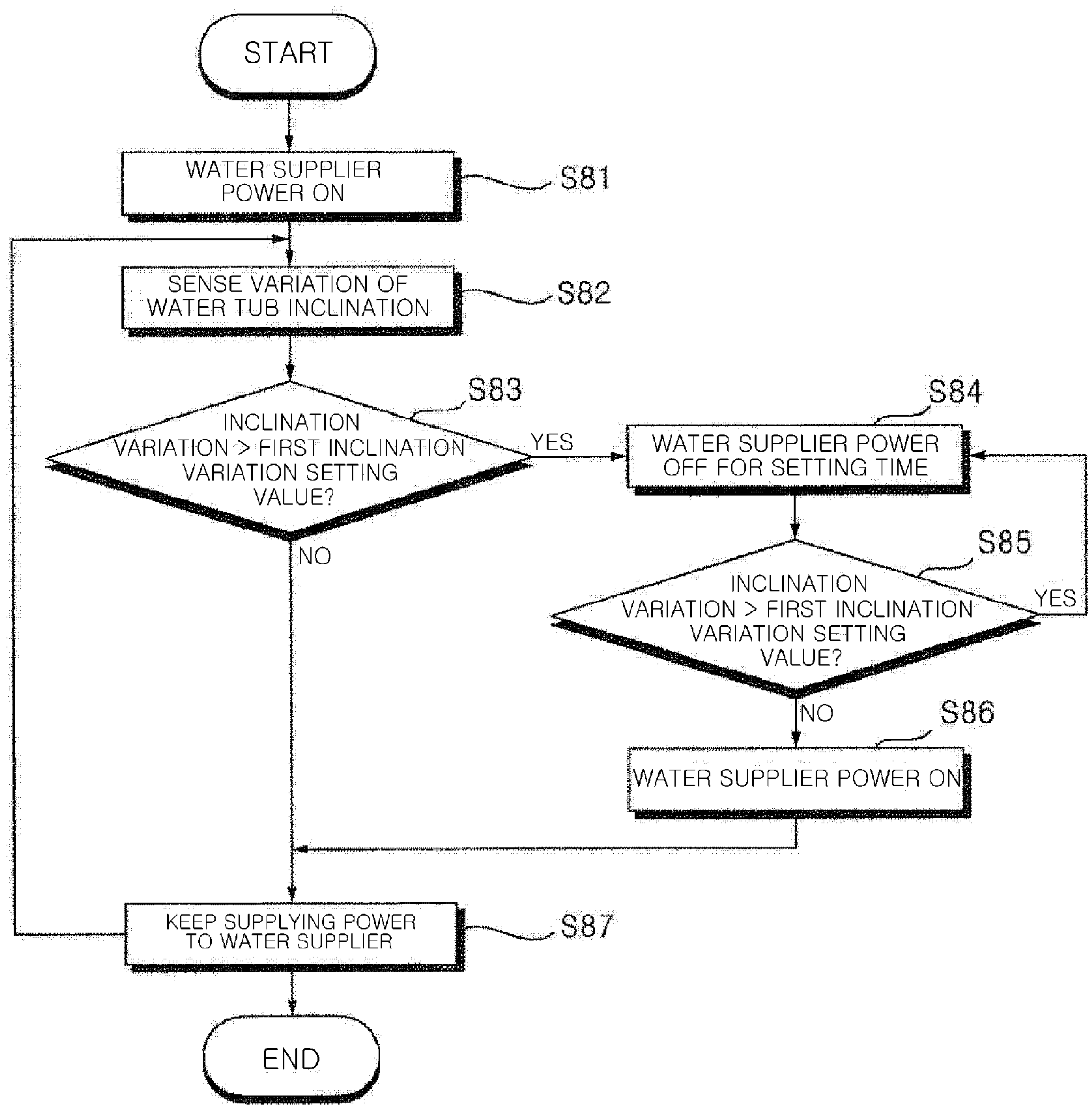
FIG. 20 is a flowchart showing a control method using a gyro sensor of a water supplier for a pet according to an eighth embodiment of the present disclosure.

Hereafter, a method of controlling a water supplier in accordance with the variation of the inclination of a water tub according to an eighth embodiment of the present disclosure is described with reference to FIGS. 17, 20, and 21. The configuration excepting the control method to be described hereafter is the same as the configuration of the sixth embodiment of the present disclosure.

Other than cutting power in accordance with the inclination of the water tub, it may also be required to cut power in accordance with the variation of the inclination of the water tub. When the variation of the inclination of the water tub is large, it means that a large external force is applied and the water tub is rapidly inclined. Accordingly, a pet may not cope with rapid movement of the water tub and may get shocked or may be injured. Further, a pet may be greatly shocked when coming in contact with the water tub rapidly moving. Accordingly, a method of controlling the water supplier for maximally preventing these dangers is also required.

When the water supplier is turned on and water is being supplied through the pump 20 (S81), the gyro sensor 88 senses the variation of the inclination of the water tub 10 (S82) and transmits this situation to the controller C. The controller C determines whether the variation of the inclination of the water tub is larger than a predetermined first inclination variation setting value (S83).

The first inclination variation setting value may be a value at which the water supplier overturns when it exceeds the inclination variation setting value or may be a setting value at which a pet may get shocked due to considerable shaking of the water supplier while the water supplier returns to the initial position even though it does not overturn.

When the variation of the inclination of the water tub is smaller than the first inclination variation setting value, power keeps being supplied to the water supplier (S87), but when the variation of the inclination of the water tub is larger than the first inclination variation setting value, the power for the water supplier is cut for a predetermined setting time (S84) such that a pet do not get shocked.

After the setting time passes, the controller compares again the variation of the inclination of the water tub with the first inclination variation setting value (S85), cuts again the power for the water supplier for the setting time when the inclination of the water tub is larger than the first inclination setting value (S84), but supplies again power to the water supplier when the variation of the inclination of the water tub is smaller than the first inclination variation setting value (S86) such that water can be supplied again.

As described above, power is cut to prevent an electric shock and an injury of a pet, but when the water supplier has a considerable inclination variation before reaching at the first inclination variation setting value, there is still the danger of an electric shock and an injury.

Accordingly, in order to solve the problems described above, according to a ninth embodiment of the present disclosure, when the water tub is inclined at a second inclination variation setting value, which is smaller than the first inclination variation setting value, or more before power is cut, a warning lamp is turned on or an alarm is sounded to inform a pet or a user of the danger so that the pet or the user can avoid the danger of an electric shock or an injury. Accordingly, a user and a pet are primarily warned of a danger by turning on a warning lamp or sounding an alarm when the second inclination variation setting value is reached, and power is cut when the water tub is inclined faster the second inclination variation setting value and reaches the first inclination variation setting value, thereby securing two steps of protective means to prevent a pet.

Figure 21:
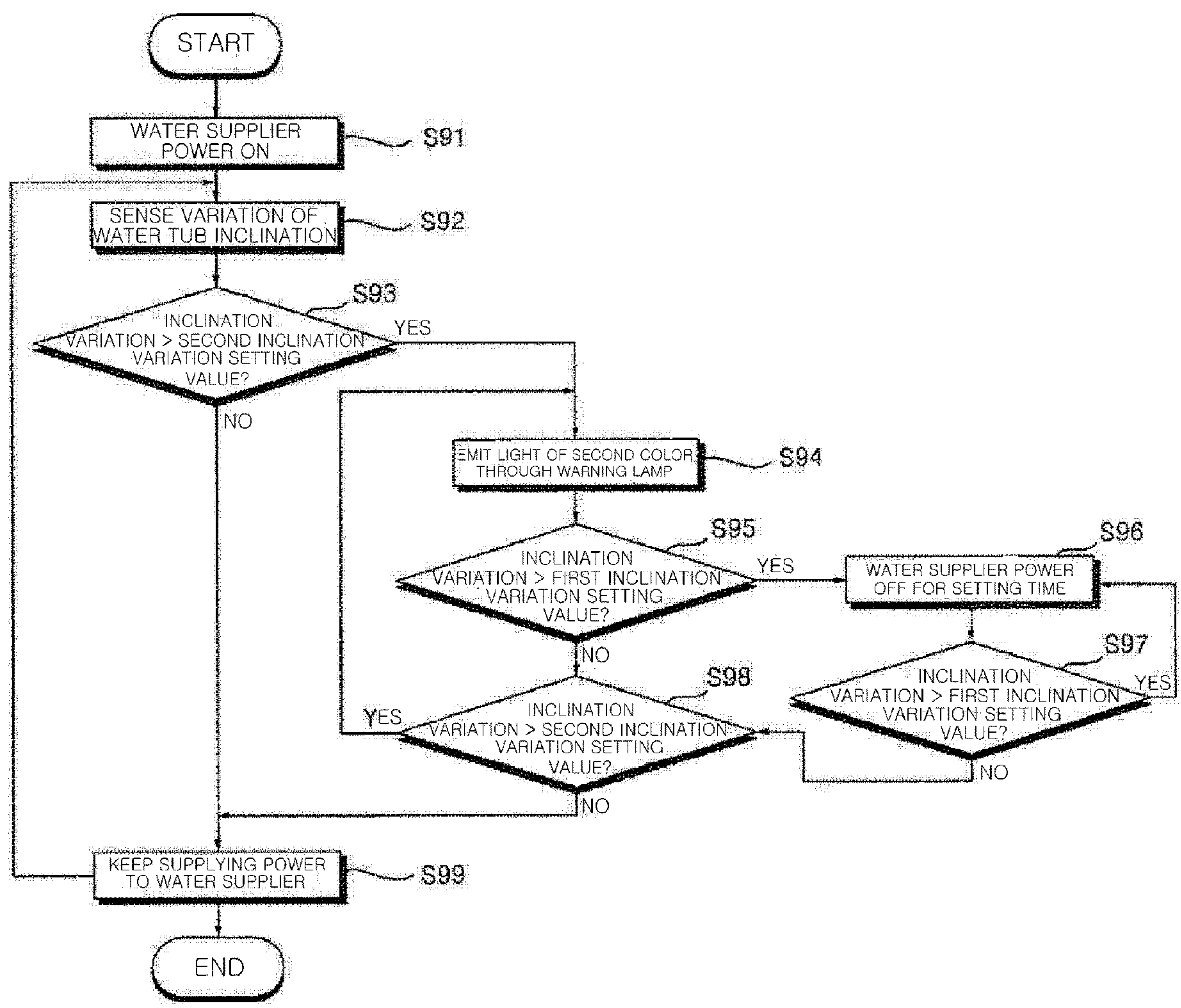
FIG. 21 is a flowchart showing a control method using a gyro sensor of a water supplier for a pet according to a ninth embodiment of the present disclosure.
Figure 22:
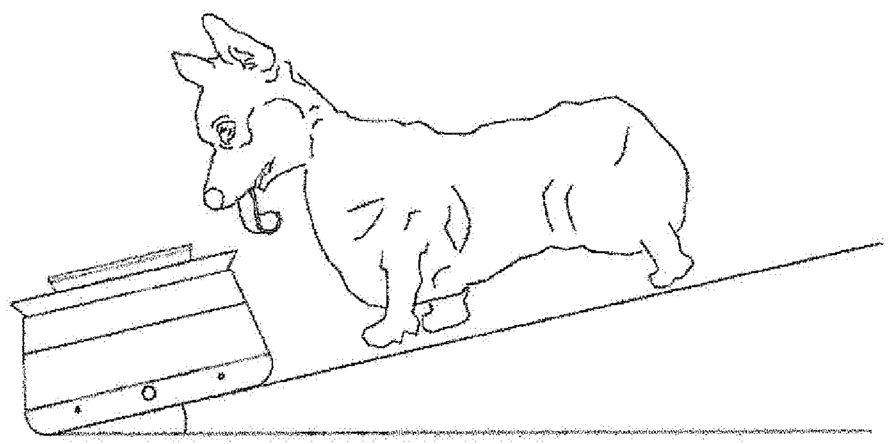
FIG. 22 is a view showing a pet drinking water from the upper portion of an inclined water supplier for a pet according to a tenth embodiment of the present disclosure.
Figure 23:
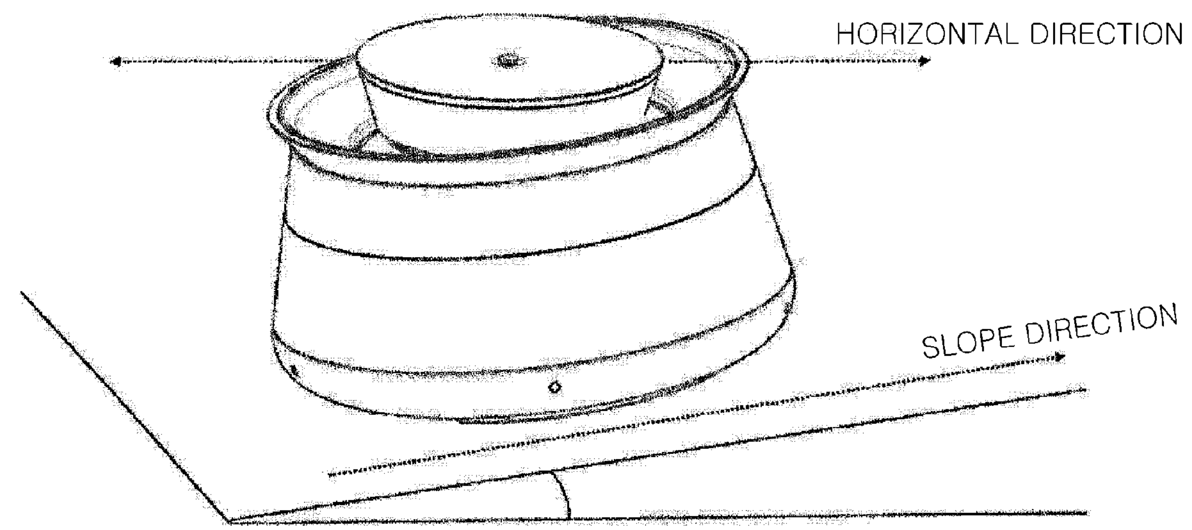
FIG. 23 is a view showing a water supplier sensing an inclination and accordingly keeping a water supply plate horizontal.
Figure 24:
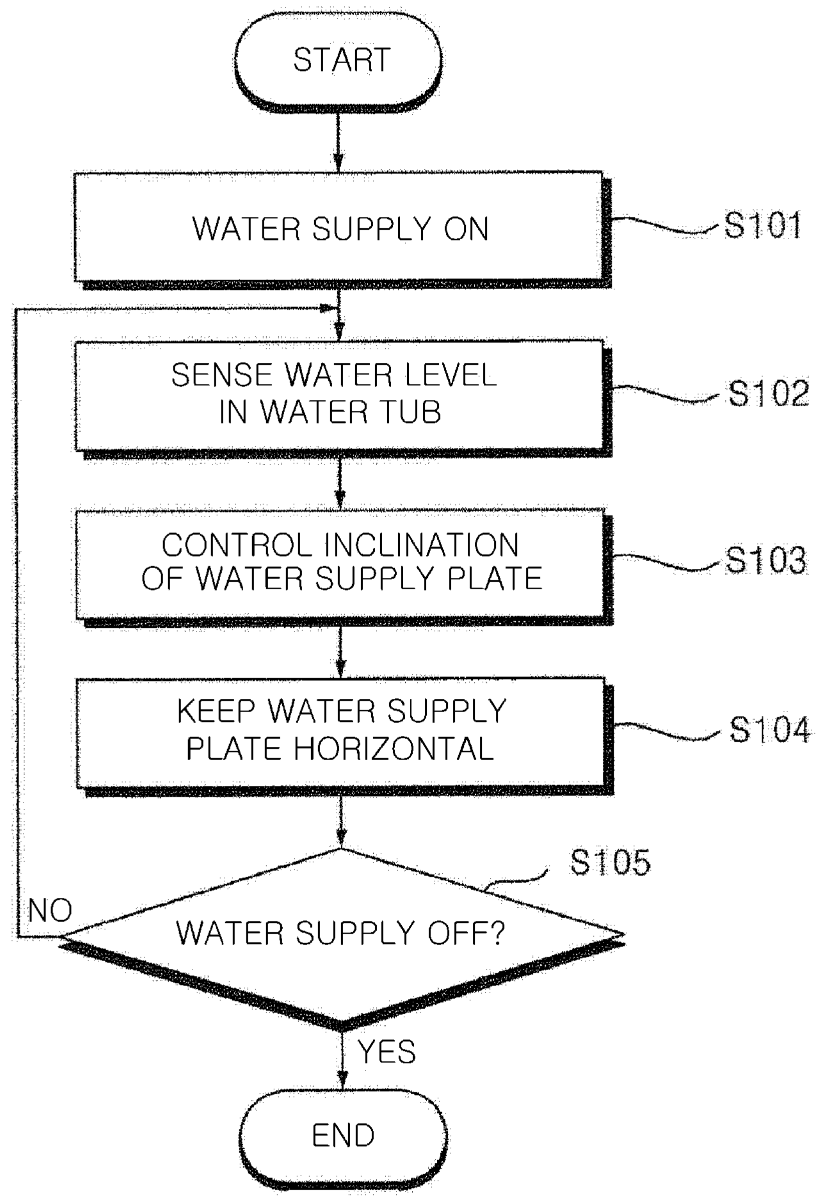
FIG. 24 is a flowchart showing a control method sensing the inclination of the water supplier for a pet according to the tenth embodiment of the present disclosure and accordingly keeping a water supply plate horizontal.

Referring to FIG. 21, when the water supplier is turned on and water is being supplied through the pump 20 (S91), the gyro sensor 88 senses the variation of the inclination of the water tub 10 (S92) and transmits this situation to the controller C. The controller C determines whether the variation of the inclination of the water tub is larger than a predetermined second inclination variation setting value (S93).

The second inclination variation setting value is set as a value smaller than the first inclination variation setting value and is smaller than the first inclination variation setting value, but is set as a value that can minimize the danger of an electric shock or the danger of an injury of a pet.

When the variation of the inclination of the water tub is larger than the second inclination variation setting value, the warning lamp 91 may be turned on to emit light of the second color or alarm may be generated through the alarm 92 (S94). The second color and the alarm may be a color and a sound that enable a pet to recognize a danger. The first color and the second color may be different colors or may be the same colors.

When it is determined that the variation of the inclination of the water tub is larger than the first inclination variation setting value after the warning lamp is turned and the alarm is generated (S95), power for the water supplier is cut for setting time (S96). The warning lamp and the alarm may not be operated after power is cut, or the warning lamp and the alarm may be operated by an auxiliary power device even after power is cut.

When the variation of the inclination of the water tub is smaller than the first inclination variation setting value, whether the inclination variation is larger than the second inclination variation setting value is determined (S98). In this case, when the variation of the inclination of the water tub is larger than the second inclination variation setting value, the warning lamp can be turned on and alarm can be generated through the alarm (S94). When the inclination of the water tub is smaller than the second inclination variation setting value, power keeps being supplied to the water supplier (S99).

After power for the water supplier is cut for setting time (S96), the controller C determines again the variation of the inclination of the water tub, cuts again the power for the water supplier for the setting time when the inclination of the water tub is larger than the first inclination variation setting value (S97), and determines whether the variation of the inclination of the water tub is larger than the second inclination variation setting value when the variation of the inclination of the water tub is smaller than the first inclination variation setting value (S98). Then the variation of the inclination of the water tub is larger than the second inclination variation setting value, the warning lamp can be turned on and alarm can be generated through the alarm (S94), and when the variation of the inclination of the water tub is smaller than the second inclination variation setting value, power keeps being supplied to the water supplier (S99).

The configuration excepting for the control method according to the ninth embodiment of the present disclosure is the same as the configuration according to the sixth embodiment of the present disclosure.

Hereafter, a method of controlling a water supply plate in accordance with the inclination of a water tub according to a tenth embodiment of the present disclosure is described with reference to FIGS. 22 to 26. The configuration excepting the control method to be described hereafter is the same as the configuration of the sixth embodiment of the present disclosure.

In order to solve the problem that unbalanced water supply depending on approach directions that may be generated when the water supplier is placed on a slope, as described above, according to the tenth embodiment of the present disclosure, it is possible to sense the inclination of the water tub through the gyro sensor and keep the water supply plate 30 horizontal by correcting the inclination.

When the water supply plate keeps horizontal, water can be uniformly supplied to the top of the water supply plate regardless of the direction, so the amount of water dropping from the edge of the water supply plate is also uniform. Accordingly, a pet can be supplied with an appropriate amount of water regardless of the direction in which the pet approaches the water supplier.

When the water supplier is turned on and water is being supplied through the pump 20 (S101), the gyro sensor 88 senses the inclination of the water tub 10 (S102). When the sensed information is transmitted to the controller C, the controller calculates inclination direction and angle at which the water supply plate 30 can keep horizontal through correction and controls the inclination of the water supply plate on the basis of the information so that the water supply plate can keep horizontal (S104). Similarly, since the inclination of the water tub may be changed by reasons such as when the water tub is installed at another place, unless water supply is finished (S105), the process of correcting the inclination and controlling the inclination of the water supply plate can be repeatedly performed.

Figure 25:
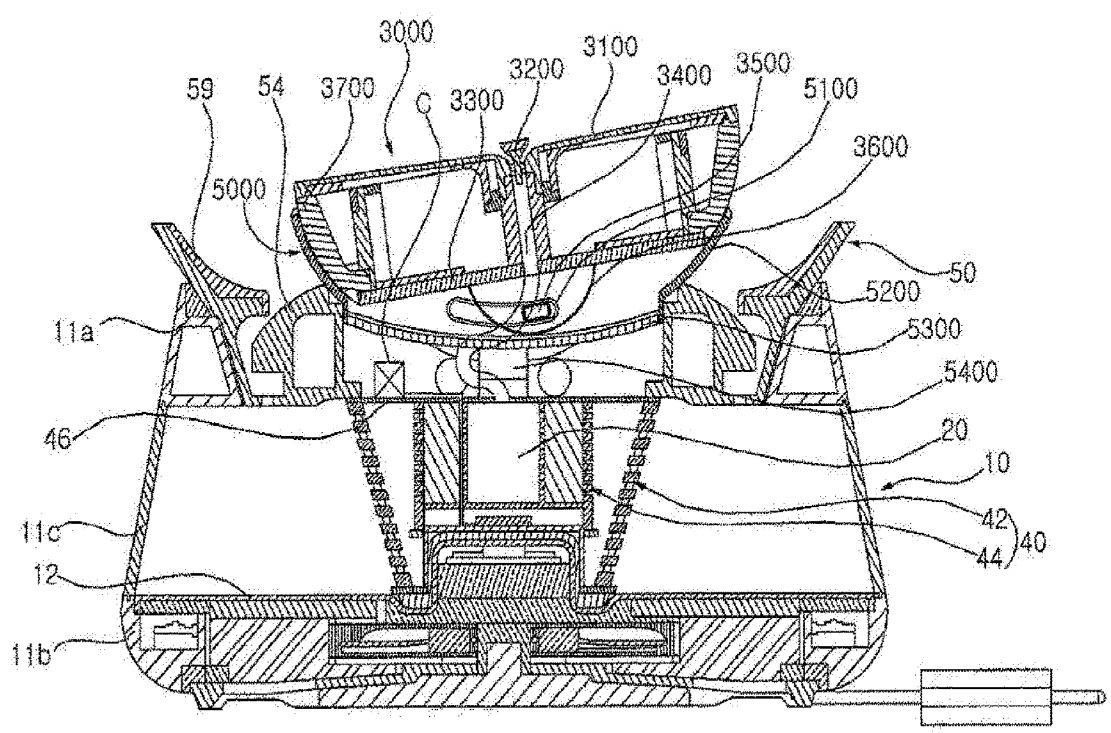
FIG. 25 is a side cross-sectional view of the water supplier for a pet according to the tenth embodiment of the present disclosure.

Hereafter, the configuration of a water dispenser 3000 and a water dispenser rotor 5000 that are rotated to keep the water supply plate horizontal is described through the tenth embodiment of the present disclosure with reference to FIG. 25. Configuration excepting for the configuration of the water dispenser and the water dispenser rotor to be described hereafter is the same as the configuration of the sixth embodiment of the present disclosure.

According to the tenth embodiment of the present disclosure, in order to control the inclining of the water dispenser 3000 including a water supply plate 3100, a light guide plate 3700, a partition wall 3300, etc., a water dispenser rotor 5000 is disposed under the water dispenser 3000 and can rotate the water dispenser 3000 such that the water supply plate 3100 can keep horizontal.

The water dispenser 3000 includes; the water supply plate 3100 on which water supplied from a water supply hole flows; a water supply hole 3200 communicating with a water supply pipe and supplying water to the water supply plate; a water supply pipe 3400 connected to a pump to deliver water from the pump to the water supply plate; a moving part 3500 coupled to the bottom of the water dispenser, inserted into a water dispenser rotation guide 5100, and determining the inclination of the water dispenser in accordance with a movement position while moving along the water dispenser guide; a moving support 3600 connecting and supporting the water dispenser and the moving part; and a light guide plate 3700 disposed outside the water dispenser.

The configuration of the water supply plate 3100, the water supply hole 3200, and the partition plate 3300 is the same as the configuration of the sixth embodiment. It is the same as the sixth embodiment that the water supply pipe 3400 is connected to a pump, but in the tenth embodiment of the present disclosure, the water dispenser 300 can incline and simultaneously rotate, so the water supply pipe 3400 may be made of an extendable and flexible material. Accordingly, the water supply pipe can bend and the water delivered from the pump can be stably supplied to the water supply plate 3100 regardless of rotation and movement of the water supply pipe 3400. In the tenth embodiment of the present disclosure, the water supply pipe is a bellows or a hose, but is not limited thereto and may be made of various extendable materials.

The moving part 3500 can adjust the slope angle of the water supply plate 3100 while moving through the water dispenser rotation guide 5100. The moving part can be moved by a second motor (not shown) receiving a signal from the controller C. Other than the second motor, various device may be used to move the moving part. As the moving part is moved, the water supply plate 3100 can form a slope in the vertical direction of the water supplier.

The moving part support 3600 is combined with the moving part such that the moving part 3500 can stably move through the water dispenser rotation guide 5100 without separating from the water dispenser rotation guide 5100. The moving part support 3600 connects the moving part 3500 and the partition plate 3300 and a rotor base 5300 is disposed under the moving part support 3600 with a predetermined gap therebetween to prevent wear due to contact between the rotor base 5300 and the moving part support 3600.

The material of the light guide plate 3700 is the same as that in the sixth embodiment of the present disclosure, but in the tenth embodiment, unlike the sixth embodiment, the light guide plate is convex with a curvature the same as the curvature of the water dispenser support 5200 so that the water dispenser 300 can smoothly rotate.

The water dispenser rotor 5000 includes: a water dispenser rotation guide 5100 in which the moving part 3500 of the water dispenser 3000 can be inserted to be able to move; a water dispenser support 5200 supporting the water dispenser when the water dispenser 300 is rotated; a rotor base 5300 disposed under the water dispenser rotor 5000 and supporting the water dispenser and the water dispenser rotor; and a first motor 5400 disposed under the rotor base 5300 and horizontally rotating the water dispenser rotor 500.

The water dispenser rotation guide 5100 has an oblong opening having a predetermined curvature, the moving part 3500 of the water dispenser 3000 can be inserted through the opening, and when the inserted moving part 3500 moves along the opening having the curvature, the entire water dispenser 3000 combined with the moving part can rotate along the curvature of the water dispenser rotation guide 5100. Accordingly, when the moving part 3500 moves along the water dispenser rotation guide 5100, the water dispenser 3000 can determine the inclination of the water supply plate 3100 in accordance with the movement position of the moving part 3500.

The water dispenser support 5200 can rotatably support the water dispenser 3000. The water dispenser support 5200 has the same radius of curvature as the light guide plate 3700, thereby being able to function as a guide according to movement of the light guide plate 3700 when the water dispenser 3000 rotates. Further, the water dispenser support may be made of the same material as the light guide plate 3700, thereby being able to transmit light from a luminous body to the outside regardless of whether the water dispenser 3000 rotates.

The rotor base 5300 is provided to support all of the components of the water dispenser 300 and the component of the water dispenser rotor 5000. Further, the rotor base can be horizontally rotated by the first moor 5400 disposed under the rotor base 5300. As the rotor base is horizontally rotated, the water dispenser rotor 5000 and the water dispenser 300 are simultaneously rotated.

Figure 26:
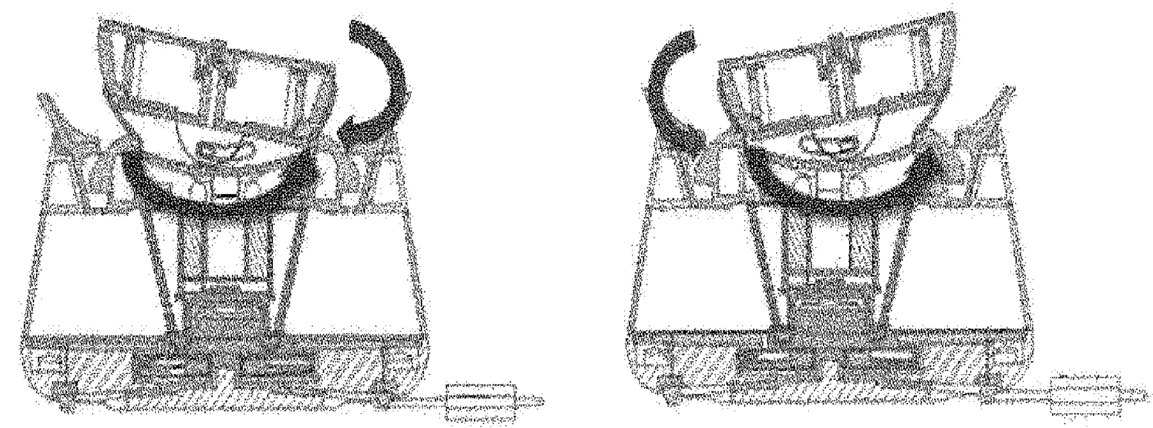
FIG. 26 is a view showing rotation of a water dispenser of the water supplier for a pet according to the tenth embodiment of the present disclosure.

A process of adjusting the slope angle of the water supply plate (S103) is described hereafter with reference to FIGS. 25 and 26.

The controller C senses an inclination signal sensed by the gyro sensor 88 and transmits motor control signal according to an inclination correction value of the water supply plate 3100 to the first motor 5400 and the second motor (not shown). The first motor 5400 rotates the rotor base 5300 by a setting angle according to the inclination correction value in the horizontal direction of the water supplier such that the water dispenser 3000 rotates horizontally at the setting angle. Further, the second motor (not shown) rotates the water dispenser 3000 by a setting angle according to the inclination correction value in the vertical direction of the water supplier such that the water dispenser 3000 rotates vertically at the setting angle. Accordingly, as the first motor 5400 and the second motor (not shown) are operated, the water supply plate 3100 of the water dispenser 3000 three-dimensionally rotate in accordance with a setting value to form a surface perpendicular to the direction of gravity.

The water dispenser rotor 5000 can be detached from the water supplier. Accordingly, if necessary, it is possible to separate the water dispenser rotor 5000 from the water supplier and seat the water dispenser 3000 on the guide 54 in accordance with the sixth embodiment of the present disclosure.

Further, the accompanying drawings are provided only for easy understanding of embodiments disclosed in the specification, the technical spirit disclosed in the specification is not limited by the accompanying drawings, and all changes, equivalents, and replacements should be understood as being included in the spirit and scope of the present disclosure.

Although exemplary embodiments of the present disclosure were illustrated and described above, the present disclosure is not limited to the specific exemplary embodiments and may be modified in various ways by those skilled in the art without departing from the scope of the present disclosure described in claims, and the modified examples should not be construed independently from the spirit of the scope of the present disclosure.

What is claimed is:

1. A water supplier for a pet, comprising:
- a water tub storing water;
- a pump installed in the water tub;
- a water supply pipe delivering water discharged from the pump;
- a water supply plate disposed over the water tub and having a top on which water supplied from the water supply pipe flows;
- a water supply place rotor that rotates the water supply plate at a lower side of the water supply plate;
- a sensor installed at a lower portion of the water tub; a gyro sensor that senses an inclination of the water tub; and
- a controller that compares a value sensed by the sensor with a predetermined setting value and manages the water suppler plate rotor to compensate for the inclination of the water tub detected by the gyro sensor to maintain a horizontal inclination of the water supply plate.

2. The water supplier of claim 1, further comprising a thermoelectric element cooling the water stored in the water tub,
- wherein the sensor includes a water temperature sensor sensing the temperature of the water stored in the water tub, and
- the controller operates the thermoelectric element when the temperature sensed by the water temperature sensor is a first water temperature sensor value or more.

3. The water supplier of claim 2, wherein the water tub has a floor plate and a side wall, and
- the thermoelectric element is disposed under the floor plate.

4. The water supplier of claim 2, wherein the water tub has a floor plate and a side wall,
- the side wall has a lower edge wall disposed under the floor plate and further has a base covering a bottom of the lower edge wall, and
- the water temperature sensor is disposed between the floor plate and the base.

5. The water supplier of claim 1, wherein the sensor includes a water level sensor sensing the level of water stored in the water tub, and
- the controller operates a warning unit when the water level sensed by the water level sensor is a first water level setting value or less.

6. The water supplier of claim 5, wherein the controller operates the warning unit when the water level sensed by the water level sensor is a second water level setting value, which is larger than the first water level setting value.

7. The water supplier of claim 5, wherein the water tub has a floor plate and a side wall, the side wall has a lower edge wall disposed under the floor plate, and the water level sensor is disposed on an edge surface protruding inside the lower edge wall.

8. The water supplier of claim 1, wherein the sensor includes a plurality of proximity sensors sensing a pet within a predetermined distance range, and the controller operates the pump installed in the water tub when at least one of the proximity sensors senses the pet over a setting time.

9. The water supplier of claim 8, wherein the controller increases a pumping volume of the pump when the number of proximity sensors sensing a pet over the setting time increases while the pump is operated.

10. The water supplier of claim 8, wherein the water tub has a floor plate and a side wall, the side wall has a lower edge wall disposed under the floor plate, and the proximity sensors are installed inside the lower edge wall.

11. The water supplier of claim 1, wherein the water tub has a side wall forming a side, the side wall has a lower edge wall having a rounded lower portion, and the gyro sensor is disposed inside the lower edge wall.

12. The water supplier of claim 1, comprising a warning lamp showing a danger signal and disposed at a lower portion of the water tub, wherein the warning lamp is turned on to output a first color when the inclination sensed by the gyro sensor is larger than an inclination setting value.

13. The water supplier of claim 1, the controller cuts power when an inclination variation sensed by the gyro sensor is larger than an inclination variation setting value.

* * * * *